United States Patent [19]
Makita et al.

[11] Patent Number: 5,851,860
[45] Date of Patent: Dec. 22, 1998

[54] SEMICONDUCTOR DEVICE AND METHOD FOR PRODUCING THE SAME

[75] Inventors: Naoki Makita, Nara; Takashi Funai, Tenri, both of Japan

[73] Assignee: Sharp Kabushiki Kaisha, Osaka, Japan

[21] Appl. No.: 458,685

[22] Filed: Jun. 2, 1995

[30] Foreign Application Priority Data

Jul. 15, 1994 [JP] Japan ..................................... 6-164380
Jul. 15, 1994 [JP] Japan ..................................... 6-164381

[51] Int. Cl.$^6$ ................................................... H01L 21/84
[52] U.S. Cl. ........................................... 438/166; 438/486
[58] Field of Search ............................... 437/21, 40 TFT, 437/41 TFT, 101; 117/7, 8; 438/151, 166, 907, 908, 485–486

[56] References Cited

U.S. PATENT DOCUMENTS

| | | | |
|---|---|---|---|
| 4,015,558 | 4/1977 | Small et al. ................................. | 118/6 |
| 5,403,772 | 4/1995 | Zhang et al. ............................ | 437/101 |
| 5,426,064 | 6/1995 | Zhang et al. ............................. | 437/40 |
| 5,501,989 | 3/1996 | Takayama et al. ........................ | 437/21 |
| 5,523,257 | 6/1996 | Yamazaki et al. . | |
| 5,569,610 | 10/1996 | Zhang et al. ............................. | 437/21 |
| 5,578,520 | 11/1996 | Zhang et al. . | |

FOREIGN PATENT DOCUMENTS

| | | |
|---|---|---|
| 2-61032 | 12/1990 | Japan . |
| 3-4564 | 1/1991 | Japan . |
| 3-291972 | 12/1991 | Japan . |
| 04-177736 | 6/1992 | Japan . |
| 4-245482 | 9/1992 | Japan . |
| 5-551142 | 3/1993 | Japan . |
| 5-136048 | 6/1993 | Japan . |
| 5-218156 | 8/1993 | Japan . |
| 5-243575 | 9/1993 | Japan . |
| 6-244103 | 9/1994 | Japan . |
| 6-244104 | 9/1994 | Japan . |

OTHER PUBLICATIONS

Dvurechenskii et al., "Transport Phenomena in Amorphous Silicon Doped by Ion Implantation of 3d Metals", phys. stat. sol. (a), vol. 95, pp. 635–640, 1986.

Kuznetsov et al., "Silicide precipitate formation and solid phase regrowth of Ni+–implanted amorphous silicon" Inst. Phys. Conf. Ser. No. 134, Section 4, Paper presented at Microsc. Mater. Conf., Oxford, 5–8 Apr. 1993, pp. 191–194.

Cammarata et al., "NiSi2 precipitation in nickel–implanted silicon films", Appl. Phys. Lett., vol. 51, No. 14, 5 Oct. 1987, pp. 1106–1108.

Kuznetsov et al., "Enhanced solid phase epitaxial recrystallization of amorphous silicon due to nickel silicide precipitation resulting from ion implantation and annealing" Nuclear Instruments and Methods in Physics Research B80/81, 1993, pp. 990–993.

Hayzelden et al., "Silicide formation and silicide–mediated crystallization of nickel–implanted amorphous silicon thin films" J. Appl. Phys., vol. 73, No. 12, 15 Jun. 1993, pp.8279–8289.

Cammarata et al., "Silicide precipitation and silicon crystallization in nickel implanted amorphous silicon thin films", J. Mater. Res., vol. 5, No. 10, 10 Oct. 1990, pp. 2133–2138.

Ghandhi, VLSI Fabrication Principles, Silicon and Gallium Arsenide, John Wiley & Sons, 1983, pp.353–354.

Primary Examiner—John F. Niebling
Assistant Examiner—Richard A. Booth
Attorney, Agent, or Firm—David G. Conlin; Peter F. Corless; Dike, Bronstein, Roberts & Cushman, LLP

[57] ABSTRACT

The semiconductor device of the invention includes: a substrate having an insulating surface; an active region formed on the insulating surface of the substrate, the active region being formed by a crystalline silicon film; and an insulating thin film formed on the active region. In the semiconductor device, the active region contains a catalyst element for promoting a crystallization of an amorphous silicon film by a heat treatment.

10 Claims, 9 Drawing Sheets

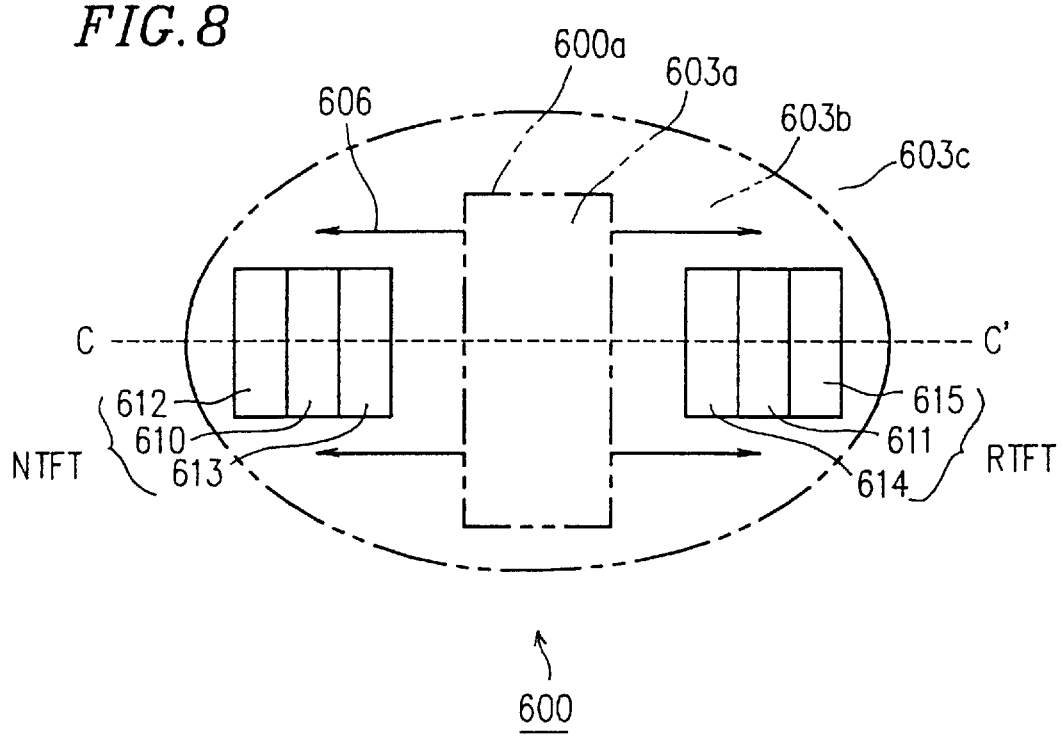

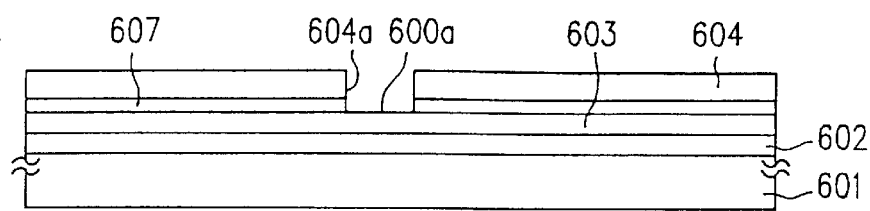
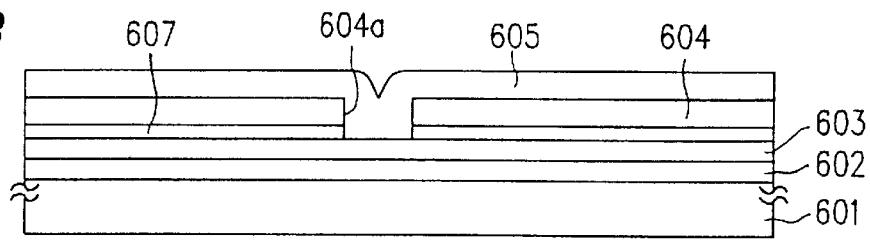
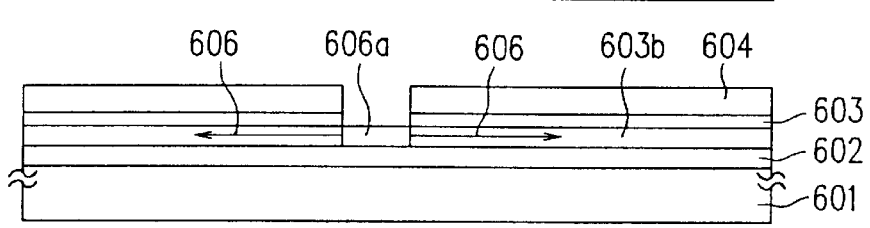
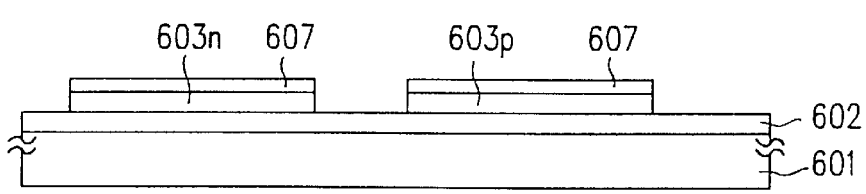
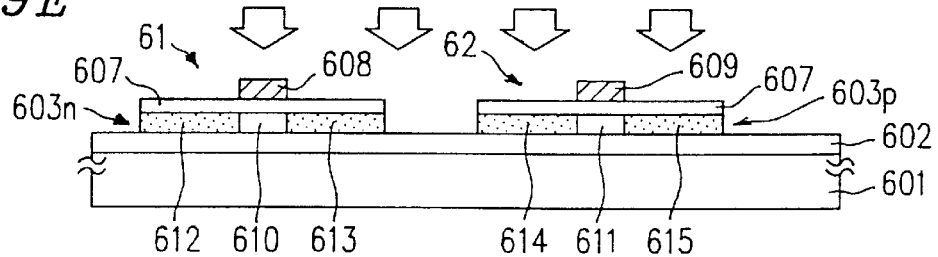
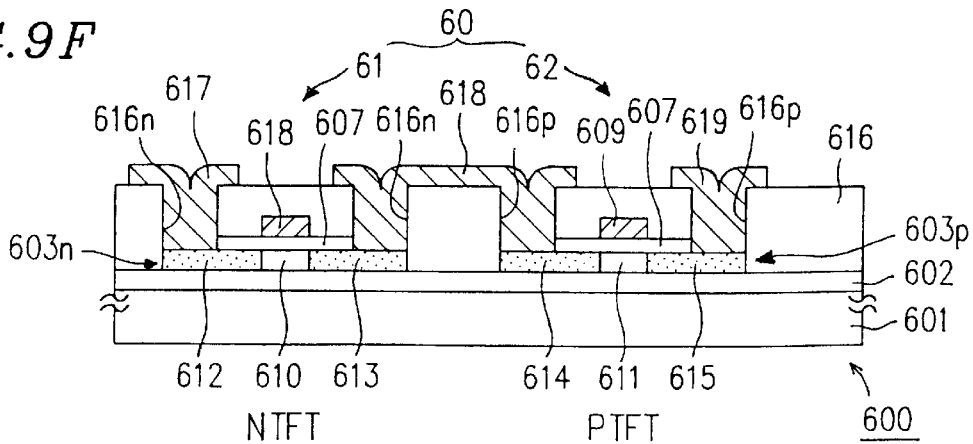

SEMICONDUCTOR DEVICE AND METHOD FOR PRODUCING THE SAME

BACKGROUND OF THE INVENTION

1. Field of the Invention

The present invention relates to a semiconductor device and method for producing the same. More specifically, the present invention relates to a semiconductor device using a crystalline silicon film obtained by crystallizing an amorphous silicon film as an active region; and a method for producing the same. The present invention is particularly effective to a semiconductor device including a thin-film transistor (TFT) provided on an insulating substrate; and as such, is applicable to an active-matrix type liquid crystal display device, a close-contact type image sensor, a three-dimensional IC, and the like.

2. Description of the Related Art

In order to realize a large-scale liquid crystal display device with a high resolution, a fast-response close-contact image sensor or a three-dimensional IC with a high resolution and the like, much effort has been made for forming a high-performance semiconductor device on an insulating film. A thin-film silicon semiconductor layer is generally used for a semiconductor device applicable to these devices.

Such a thin-film silicon semiconductor layer is roughly classified into two categories; namely, that made of an amorphous silicon (a-Si) semiconductor and that made of a crystalline silicon semiconductor. Of the above-mentioned two types of thin-film silicon semiconductors, an amorphous silicon semiconductor is currently used most frequently for general applications. This is because an amorphous silicon semiconductor can be mass-produced using a vapor-phase growing method more easily and at a relatively low temperature as compared with a crystalline silicon semiconductor. Despite these advantages, the physical properties, e.g., conductivity, of the amorphous silicon semiconductor are inferior to those of the crystalline silicon semiconductor. In order to realize higher performance characteristics, there has been a great demand for the establishment of a method for producing a semiconductor device made of a crystalline silicon semiconductor. Examples of a crystalline silicon semiconductor include polycrystalline silicon, microcrystalline silicon, amorphous silicon containing a crystalline component, and semi-amorphous silicon exhibiting an intermediate state between crystallinity and non-crystallinity.

The following three methods are currently employed for obtaining the above-mentioned thin-film silicon semiconductor layer exhibiting some crystallinity:

(1) A crystalline silicon semiconductor film is grown directly on a substrate during the deposition of the film.

(2) An amorphous silicon semiconductor film is initially deposited, and subsequently crystallized using laser beam energy or the like.

(3) An amorphous silicon semiconductor film is initially deposited, and subsequently crystallized by the application of thermal energy.

These conventional methods, have the following problems:

In employing method (1), the deposition and the crystallization of the film proceed simultaneously. Therefore, it is indispensable to deposit a thick silicon film in order to obtain a crystalline silicon composed of grains having a large size. However, it is technologically difficult to uniformly deposit a film having satisfactory semiconductor physical properties over the entire surface of a substrate. Furthermore, since such a film is deposited at a relatively high temperature of 600° C. or more, an inexpensive glass plate is unsuitable as a substrate which can be used in this method, so that the necessary cost becomes disadvantageously high.

In employing method (2), a crystallization phenomenon is utilized during a process for melting and solidifying a film. As a result, the grain boundaries are satisfactorily treated even though the grain size of the resulting crystal is small. Thus, a crystalline silicon film of high quality can be obtained. In spite of these advantages, in the case of irradiating an excimer laser beam which is currently used most frequently, the area to be irradiated with a laser beam is small, so that throughput is disadvantageously low. In addition, the stability of the excimer laser is not sufficient in order to uniformly treat the entire surface of a large-scale substrate. In light of these problems, method (2) should be regarded as a next-generation technology.

Method (3) has an advantage of being applicable to the treatment of a larger-scale substrate as compared with methods (1) and (2), however, a heat treatment at a high temperature of 600° C. or more over several tens of hours is needed to realize the crystallization. Thus, in order to reduce costs by using an inexpensive glass substrate and improve the resulting throughput, two incompatible purposes must be fulfilled at the same time: the heating temperature should be lowered for the purpose of reducing the cost, and the crystallization should be realized in a short period of time in order to improve the throughput.

In addition, since method (3) utilizes a solid phase crystallization (epitaxy) phenomenon, crystal grains are laterally grown in parallel with respect to the substrate surface, so that grains having a size of several $\mu$m are obtained. As a result, the crystal grains thus grown come into contact with each other so as to form grain boundaries. Since these grain boundaries function as a trap level for carriers, the presence of the grain boundaries is likely to cause the decrease in field-effect mobility of TFTs.

Japanese Laid-Open Patent Publications Nos. 5-55142 and 5-136048 disclose methods for solving the above-described problems of the grain boundaries by employing method (3). According to these disclosed methods, by initially introducing some foreign material into an amorphous silicon film as a nucleus for crystal growth and then by heat-treating the film, a crystalline silicon film composed of grains having a large size can be grown by using the foreign material as a nucleus.

According to a method disclosed in Japanese Laid-Open Patent Publication No. 5-55142, by implanting silicon ($Si^+$) ions into an amorphous silicon film by an ion implantation method and then by heat-treating the film, a polycrystalline silicon film composed of grains having a size of several $\mu$m can be grown. According to a method disclosed in Japanese Laid-Open Patent Publication No. 5-136048, by spraying Si particles having a size of 10 to 100 nm along with a high-pressure nitrogen gas to an amorphous silicon film, a growth nucleus is formed. Both of these two methods selectively introduce a foreign material into an amorphous silicon film, and grows a crystalline silicon film of high quality using the material as a nucleus, thereby forming a semiconductor device using such a film.

In order to realize a high-performance metaloxide-semiconductor (MOS) transistor, not only a crystalline silicon film to be used as an active region for the transistor, but also a gate insulating film are required to exhibit high quality. An interface between a semiconductor thin-film and a gate insulting film in the active region must also exhibit high quality.

In an MOS transistor to be produced on a Si substrate by a conventional IC process, the surface of the Si substrate is thermally oxidized and the resulting thermally oxidized silicon film is used as a gate insulating film. As a result, the interface between an active layer and the gate insulating film is kept clean, and therefore an oxidized silicon film of very high quality can be employed as a gate insulating film.

However, the substrate must be heated at a high temperature of 1000° C. or more in order to perform this thermally oxidizing process, so that this process is unsuitable for a TFT to be produced on an inexpensive glass substrate. Even if a thermally oxidized film is formed by using a highly heat-resistant substrate such as a quartz substrate, a silicon film to be subjected to the thermal oxidation is not a single crystalline silicon film but a crystalline silicon film. Accordingly, the insulation properties of the oxidized silicon film to be obtained by oxidizing the crystalline silicon film are poor, and therefore the oxidized silicon film is far from being usable as a gate insulating film.

In a semiconductor device using a crystalline silicon film to be formed on an insulating substrate, the gate insulating film is required to be formed separately by a low-temperature growth method such as a chemical vapor deposition (CVD) method. According to a method disclosed in Japanese Laid-Open Patent Publication No. 3-4564, a semiconductor layer (amorphous silicon film) and a gate insulating film are continuously formed by a low-temperature growth method and then these films are heat treated in order to realize a solid-phase crystallization, thereby keeping clean the interface between the semiconductor layer and the gate insulating film (hereinafter, simply referred to as a "semiconductor layer/gate insulating film interface"); realizing a high-performance TFT.

In the case of fabricating a semiconductor device such as a TFT on an insulating substrate by using a crystalline silicon film, serious problems are most likely to occur in the crystallinity of the crystalline silicon film to be used as an active region and the state of a semiconductor layer/gate insulating film interface, as described above.

The gate insulating film has the following problems. In the case of producing a gate insulating film by a low-temperature growth method, the quality of the resulting gate insulating film becomes inferior to that of a gate insulating film formed by a high-temperature oxidization method, so that a high-performance TFT can not be realized by using such a film. This is because some defect levels caused by a residual stress in the gate insulating film, dangling bonds and impurities exist in the semiconductor layer/gate insulating film interface and therefore a depletion layer does not expand. This problem can be substantially solved by keeping clean the semiconductor layer/gate insulating film interface. Accordingly, a technique disclosed in Japanese Laid-Open Patent Publication No. 3-4564 can be effectively applied for solving the problem.

With respect to a method for producing a crystalline silicon film to be used as an active region, the solid-phase crystallization method allowing for a crystallinity with a certain stability inside a substrate, as described above as method (3), is currently most preferable in view of processing a large-scale substrate. However, a crystalline silicon film produced by a conventional solid-phase crystallization method as disclosed in Japanese Laid-Open Patent Publication No. 3-4564 is likely to be largely affected by the grain boundaries and exhibits a twin crystal structure having much defect within a single crystal grain. Thus, the semiconductor layer has a twin crystal structure where much defect exists in the crystals, so that poor crystallinity of an underlying semiconductor layer is reflected when continuously forming the semiconductor layer and a gate insulating film. Accordingly, the defect level in the semiconductor layer/ gate insulating film interface cannot be reduced so much as compared with the case of continuously forming a single crystalline film and an insulating thin film, so that the effects obtained by keeping clean the semiconductor layer/gate insulating film interface is reduced. In order to realize a high performance semiconductor device, it is required to continuously form a semiconductor layer and a gate insulating film within a hermetic environment where the atmosphere is shut off, and in addition, a crystalline silicon film to be used as an active region is required to be of high quality.

According to the techniques disclosed in Japanese Laid-Open Patent Publications 5-55142 and 5-136048 proposed for obtaining a crystalline silicon film of high quality, $Si^+$ ions and Si particles are selectively introduced through a window into an amorphous silicon film, thereby forming a nucleus for crystal growth. Inside the window, not a signal crystal nucleus but multiple crystal nuclei are generated, so that crystals are grown from the respective crystal nuclei. In practice, it is impossible to form a single crystal grain by introducing $Si^{30}$ ions or Si particles through one window, but grain boundaries are formed from multiple nuclei generated inside the window.

Consequently, according to the techniques disclosed in Japanese Laid-Open Patent Publications Nos. 5-55142 and 5-136048, it is in practice impossible to control the grain boundaries. In addition, since a mask is required when selectively introducing $Si^+$ ions or Si particles as the nuclei for crystal growth, an additional step is required to be conducted though the step does not have any direct relation to the essential process for producing a semiconductor device. Such a method has a serious disadvantage in the reproducibility thereof, and the cost of the resulting product becomes adversely high.

In the case of using an inexpensive glass substrate, the shrinkage and/or the deflection of the substrate are undesirably generated during the heat treatment for crystallization. For example, Corning 7059 glass (product name: manufactured by Corning) generally used for an active-matrix type liquid crystal display device has a glass distortion point of 593° C. Therefore, in order to produce a large-scale substrate, the heat treatment at 593° C. or more is undesirable.

In the case of using a conventional solid-phase crystallization method, the heat treatment is required to be performed at a heating temperature of 600° C. or higher for twenty hours or more, though it depends on the method and the condition for growing the a-Si film to be used as a starting film. According to the method disclosed in Japanese Laid-Open Patent Publication No. 3-4564, the annealing is conducted at a temperature in a range of 500° to 700° C. for a long time. In order to realize the solid-phase crystallization of the a-Si film described in the examples of the patent application, in practice, it seems that the annealing is required to be conducted at a temperature of 600° C. or higher for 20 hours or more. According to the technique disclosed in Japanese Laid-Open Patent Publication No. 5-55142, the crystallization is performed at a heating temperature of 600° C. for 40 hours. According to the technique disclosed in Japanese Laid-Open Patent Publication No. 5-136048, the heat treatment is performed at a heating temperature of 650° C. or higher. These techniques can be effectively applied to an SOI substrate or an SOS substrate, however, it is difficult to produce a crystalline silicon film on an inexpensive glass substrate so as to form a semiconductor device by using these techniques.

In an MOS transistor, the properties of the semiconductor layer/gate insulating film interface for channeling are of much importance, as described above. However, in a thin-film transistor, the state of the interface opposed to the semiconductor layer/gate insulating film interface is also particularly important. This is because, when the transistor is in an OFF state, a back channel is formed in the interface opposed to the gate insulating film via the semiconductor layer, thereby causing the increase in the leak current. Consequently, in a TFT particularly requiring charge storage characteristics such as a pixel switching element and a memory element for an active-matrix substrate, it is indispensable to maintain satisfactory properties of the interface opposed to the gate insulating film for preventing the generation of the leak current caused by the back channel effect.

SUMMARY OF THE INVENTION

The semiconductor device of the invention includes: a substrate having an insulating surface; an active region formed on the insulating surface of the substrate, the active region being formed by a crystalline silicon film; and an insulating thin film formed on the active region. In the semiconductor device, wherein the active region contains a catalyst element for promoting a crystallization of an amorphous silicon film by a heat treatment.

According to another aspect of the invention, the semiconductor device of the invention includes: a substrate; a first insulating thin film formed on the substrate; an active region formed on the first insulating thin film, the active region being formed by a crystalline silicon film; and a second insulating thin film formed on the active region. In the semiconductor device, the active region contains a catalyst element for promoting a crystallization of an amorphous silicon film by a heat treatment.

In one embodiment, the active region contains crystal grains substantially in a single crystalline state.

In another embodiment, the semiconductor device includes an MOS transistor having a channel region including at least a part of the active region; a gate insulating film including at least a part of the second insulating thin film; and a gate electrode formed on the gate insulating film.

In still another embodiment, a concentration of the catalyst element in the active region is in a range of $1 \times 10^{16}$ to $1 \times 10^{19}$ atoms/cm$^3$.

In still another embodiment, the active region contains as the catalyst element at least one element selected from a group consisting of Ni, Co, Pd, Pt, Cu, Ag, Au, In, Sn, Al and Sb.

According to still another aspect of the invention, a method for producing a semiconductor device is provided. The method includes the steps of: continuously forming an amorphous silicon film and an insulating thin film on a substrate having an insulating surface without exposing the substrate to an atmosphere; introducing a catalyst element for promoting a crystallization of the amorphous silicon film through the insulating thin film into the amorphous silicon film by an ion implantation method; and crystallizing by a heat treatment at least a portion of the amorphous silicon film, to which the catalyst element is added.

In another embodiment, the method includes the step of forming a gate insulating film for an MOS transistor from the insulating thin film.

According to still another aspect of the invention, a method for producing a semiconductor device is provided. The method includes the steps of: continuously forming a first insulating thin film, an amorphous silicon film and a second insulating thin film on a substrate without exposing the substrate to an atmosphere; introducing a catalyst element for promoting a crystallization of the amorphous silicon film through the second insulating thin film into the amorphous silicon film by an ion implantation method; and crystallizing by a heat treatment at least a portion of the amorphous silicon film, to which the catalyst element is added.

In one embodiment, the method includes the step of forming a gate insulating film for an MOS transistor from the second insulating thin film.

In another embodiment, the catalyst element is implanted into the amorphous silicon film at an implant dose ranging from $1 \times 10^{11}$ to $1 \times 10^{14}$ atoms/cm$^2$.

According to still another aspect of the invention, the semiconductor device includes: a substrate having an insulating surface; an active region formed on the insulating surface of the substrate, the active region being formed by a crystalline silicon film; and an insulating thin film formed on the active region. In the semiconductor device, the active region is a part of a laterally crystallized region formed by a crystal growth from a first crystallized region to which a catalyst element for promoting a crystallization of an amorphous silicon film by a heat treatment is introduced toward a direction parallel to the insulating surface of the substrate.

In one embodiment, the active region contains crystal grains substantially in a single crystalline state.

In another embodiment, the semiconductor device includes an MOS transistor having a channel region including at least a part of the active region; a gate insulating film including at least a part of the insulating thin film; and a gate electrode formed on the gate insulating film.

In still another embodiment, the concentration of the catalyst element in the first crystallized region is in a range of $1 \times 10^{16}$ to $1 \times 10^{19}$ atoms/cm$^3$.

In still another embodiment, the first crystallized region contains as the catalyst element at least one element selected from a group consisting of Ni, Co, Pd, Pt, Cu, Ag, Au, In, Sn, Al, P, As and Sb.

According to still another aspect of the invention, a method for producing a semiconductor device is provided. The method includes the steps of: continuously forming an amorphous silicon film and a insulating thin film on a substrate having an insulating surface without exposing the substrate to an atmosphere; selectively introducing a catalyst element for promoting a crystallization of the amorphous silicon film into a part of the amorphous silicon film by using the insulating thin film as a mask after patterning the insulating thin film; crystallizing at least a portion of the amorphous silicon film to which the catalyst element is added by a first heat treatment, thereby forming a first crystallized region; crystallizing the amorphous silicon film from the first crystallized region toward a direction substantially parallel to the insulating surface of the substrate by a second heat treatment, thereby forming a laterally crystallized region; etching a part of the insulating thin film uniformly from a surface of the insulating thin film to a predetermined depth; and forming an active region for the semiconductor device from the laterally crystallized region.

In one embodiment, a thickness of the part of the insulating thin film to be etched away is set to be equal to or larger than a diffusion distance of the catalyst element in the insulating thin film during the heat treatment.

In another embodiment, the method includes the step of forming a gate insulating film for an MOS transistor from the insulating thin film, the surface of which is etched.

According to still another aspect of the invention, a method for producing a semiconductor device is provided. The method includes the steps of: continuously forming an amorphous silicon film and an insulating thin film on a substrate having an insulating surface region without exposing the substrate to an atmosphere; forming a diffusion barrier film for preventing a catalyst element for promoting a crystallization of the amorphous silicon film from diffusing into the insulating thin film so as to cover the insulating thin film; selectively introducing the catalyst element into a part of the amorphous silicon film by using the insulating thin film and the diffusion barrier film as masks after patterning the insulating thin film and the diffusion barrier film; crystallizing by a first heat treatment at least a portion of the amorphous silicon film, to which the catalyst element is added, thereby forming a first crystallized region; crystallizing the amorphous silicon film from the first crystallized region toward a direction substantially parallel to the insulating surface of the substrate by a second heat treatment, thereby forming a laterally crystallized region in the amorphous silicon film; removing the diffusion barrier film; and forming an active region for the semiconductor device from the laterally crystallized region.

In one embodiment, the method further includes the step of irradiating a laser beam or an intense light beam onto the crystallized silicon film.

In another embodiment, a thickness of the diffusion barrier film is set to be equal to or larger than a diffusion distance of the catalyst element in the diffusion barrier film during the first or the second heat treatment.

In still another embodiment, a silicon oxide film or a silicon nitride film is used as the diffusion barrier film.

In still another embodiment, the method further includes the step of forming a gate insulating film for a thin-film transistor from the insulating thin-film.

In still another embodiment, in the step of selectively introducing the catalyst element for promoting the crystallization of the amorphous silicon film into a part of the amorphous silicon film, a solution or a compound where the catalyst element is dissolved or dispersed so as to be in contact with the part of the amorphous silicon film.

In still another embodiment, in the step of selectively introducing the catalyst element for promoting the crystallization of the amorphous silicon film into a part of the amorphous silicon film, the catalyst element is evaporated and deposited so as to be in contact with the part of the amorphous silicon film.

In still another embodiment, at least one element selected from a group consisting of Ni, Co, Pd, Pt, Cu, Ag, Au, In, Sn, Al, P, As and Sb is used as the catalyst element.

According to still another aspect of the invention, a method for producing a semiconductor device is provided. The method includes the steps of: continuously forming an amorphous silicon film and an insulating thin film on a substrate having an insulating surface region in a state where an atmosphere is shut off; selectively introducing a catalyst element for promoting the crystallization of the amorphous silicon film into a part of the amorphous silicon film; crystallizing by a first heat treatment a portion of the amorphous silicon film, to which the catalyst element is added, thereby forming a first crystallized region; crystallizing the amorphous silicon film from the first crystallized region toward a direction substantially parallel to the insulating surface of the substrate by a second heat treatment, thereby forming a laterally crystallized region in the amorphous silicon film; and forming a gate insulating film using a portion of the insulating thin film disposed over the laterally crystallized region.

In one embodiment, the method further includes the step of etching a portion of the insulating thin film containing the catalyst element from a surface thereof.

In another embodiment, the insulating thin film has a multi-layered structure at least including an insulating layer used as the gate insulating film and a diffusion barrier layer for preventing the catalyst element from diffusing into the insulating layer; and the diffusion barrier layer is etched after performing the second heat treatment.

In still another embodiment, the step of introducing a catalyst element includes the steps of: making a selected region of the insulating thin film thinner than the other region by etching; and implanting ions of the catalyst element through the thinner region.

In still another embodiment, the selected region of the insulating thin film is etched until a surface of the amorphous silicon is exposed.

In still another embodiment, the step of introducing a catalyst element includes the steps of implanting the ions of the catalyst element through the selected region of the insulating thin film into the amorphous silicon film.

Thus, the invention described herein makes possible the advantage of providing a semiconductor device allowing for forming a high-quality crystalline silicon film, having more satisfactory crystallinity as compared with a crystallinity to be obtained by a generally used solid-phase growth method, with an excellent reproducibility; for keeping clean the semiconductor layer/insulating film interface; and for using an inexpensive glass substrate such as Corning 7059 glass substrate by setting the heating temperature required for crystallization at 580° C. or lower, and a method for producing the same.

This and other advantages of the present invention will become apparent to those skilled in the art upon reading and understanding the following detailed description with reference to the accompanying figures.

BRIEF DESCRIPTION OF THE DRAWINGS

FIG. 8 is a plan view illustrating a semiconductor device and a production method thereof according to a sixth example of the invention.

FIGS. 9A to 9F are cross-sectional views sequentially showing the production steps of the semiconductor device according to the sixth example of the invention.

DESCRIPTION OF THE PREFERRED EMBODIMENTS

Figure 1A:
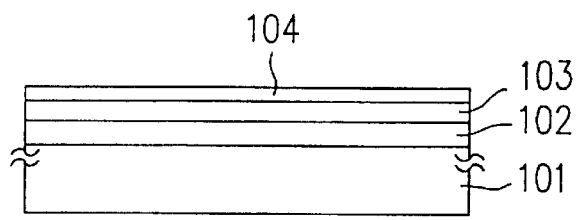
FIGS. 1A to 1E are cross-sectional views illustrating a configuration of a TFT and a production method thereof according to a first example of the invention.

In order to accomplish the above-mentioned objectives, the present inventors have found that an amorphous silicon film can be crystallized by introducing a very small amount of metal elements such as nickel, palladium and lead into the surface of the amorphous silicon film and then by heat-treating the film at 550° C. for about four hours.

This mechanism can be understood as follows. First, crystal nuclei are generated from the metal elements as the nuclei for crystal growth at an earlier stage of the heat treatment. Then the metal elements function as catalysts for promoting the crystal growth, thereby rapidly advancing the crystallization. Hereinafter, these metal elements will be called "catalyst elements". The silicon film crystallized by the use of these catalyst elements as promoters has a plurality of needle-like crystals and column-like crystals, unlike the twin crystal structure of the crystal grains grown from a nucleus by a generally used solid-phase growth method. The respective needle-like crystals and the column-like crystals are in an ideal single crystalline state.

In the case of producing a TFT by using such a crystalline silicon film as an active region, the resulting field-effect mobility can be increased approximately by 1.2 times as compared with the case of using a crystalline silicon film formed by a generally used solidphase growth method. In addition, by irradiating a laser beam or an intense light beam onto the crystallized silicon film after crystallizing the silicon film by the heat treatment, the difference between the field-effect mobility obtained by using catalyst elements for crystallization and that obtained by the solid-phase growth method becomes more considerable.

More specifically, in the case of irradiating a laser beam or an intense light beam onto the crystalline silicon film, since the crystalline silicon film and the amorphous silicon film have different melting points, the grain boundary portions are concentrically treated. While in a crystalline silicon film formed by a generally used solid-phase growth method, since the crystals have a twin crystal structure, the twin crystal defects remain inside the grain boundary portions even after irradiating the laser beam. On the other hand, the crystalline silicon film crystallized by introducing the catalyst elements are constituted by needle-like crystals and column-like crystals and substantially single crystalline state exists inside the crystalline silicon film. Therefore, the grain boundary portions are treated by irradiating a laser beam or an intense light beam and the crystallinity inside the crystal grains is promoted, so that a crystalline silicon film exhibiting a very satisfactory crystallinity can be formed over the entire surface of the substrate.

In order to improve the stability of an MOS transistor device such as a TFT among various semiconductor devices and to realize a higher-performance thereof, the above-mentioned technique for keeping clean the semiconductor layer/gate insulating film interface, that is to say, a technique for forming continuously the semiconductor layer and the gate insulating film within a closed chamber, is indispensable. In order to reduce the leak current of the TFT and improve the charge storage characteristics, a technique for keeping clean the interface opposed to the gate insulating film via the semiconductor layer is also necessary. Consequently, it is more preferable to form continuously the three layers of an underlying insulating film, a semiconductor layer and a gate insulating film.

The semiconductor layer crystallized by using the catalyst elements are composed of needle-like crystals or column-like crystals and each of the crystals is in a substantially single crystalline state. Therefore, if the semiconductor layer and the gate insulating film are continuously formed, the resulting interface characteristics are considerably improved as compared with the case of using a conventional crystalline silicon film having a twin crystal structure where many defects exist in the crystal for a semiconductor layer.

According to the above-described method for producing a crystalline silicon film found by the present inventors, an additional step for adding the catalyst elements to the semiconductor layer is required. As compared with a conventional solid-phase growth method, it is more difficult to continuously form the semiconductor layer and the gate insulating film, and then the underlying insulating film, the semiconductor layer and the gate insulating film.

The present inventors have studied a process allowing for continuously forming the semiconductor layer and the gate insulating film, and then the underlying insulating film, the semiconductor layer and the gate insulating film, which is applicable to a process for producing a TFT using as an active region a crystalline silicon film crystallized by a low-temperature annealing conducted at 580° C. or lower by adding the above-described catalyst elements.

The present inventors have found that the objectives of the invention can be accomplished by continuously forming the semiconductor layer and the gate insulating film; introducing the catalyst elements through the insulating film into the semiconductor layer by an ion implantation method; and then crystallizing the layer by a heat treatment or by irradiating a laser beam or an intense light beam onto the layer.

The present inventors have also found that the same effects can be attained by adding the catalyst elements to the lower region of the semiconductor layer, enabling the continuous formation of the semiconductor layer and the gate insulating film. However, the catalyst elements are added to the surface of the underlying film before growing the semiconductor film, so that the catalyst elements might diffuse into the underlying film. This means that the concentration of the catalyst elements to be added to the semiconductor layer cannot be precisely controlled. It is also necessary to implant the catalyst elements into the underlying insulating film, so that it is impossible to continuously form the three layers of the underlying insulating film, the semiconductor layer and the gate insulating film because of the structure thereof. Consequently, the above-described ion implantation method is the only method for continuously forming the three layers of the underlying insulating film, the semiconductor layer and the gate insulating film by introducing the catalyst elements. A TFT produced by continuously forming the semiconductor layer and the gate insulating film by adding the catalyst elements into the underlying insulating film does not exhibit a desired higher-performance characteristic.

In this case, the concentration of the catalyst elements to be introduced into the amorphous silicon film is preferably as low as possible. However, if the concentration is too low, the catalyst elements no longer function so as to promote the crystallization of the amorphous silicon film. According to the measurement results obtained by the present inventors, the minimum concentration of the catalyst elements where the crystallization still occurs is $1 \times 10^{16}$ atoms/cm$^3$. Crystallization is no longer generated by the catalyst elements having a concentration lower than this value.

If the concentration of the catalyst elements is high, then the catalyst elements adversely affect the device. The increase of the leak current mainly in the OFF state of the TFT is an exemplary phenomenon occurring when the concentration of the catalyst elements is high. This phenomenon is presumably caused by a tunnel current owing to the impurity level formed by the catalyst elements in the silicon film. According to the measurement results obtained by the present inventors, the maximum concentration of the catalyst elements where the device is not adversely affected by the catalyst elements is $1 \times 10^{19}$ atoms/cm$^3$. If the concentration of the catalyst elements in the film is in the range of $1 \times 10^{16}$ to $1 \times 10^{19}$ atoms/cm$^3$, the catalyst elements functions most effectively.

The film thickness of the active layer in the TFT is suitably in the range of 20 to 150 nm. When the film thickness is smaller than 20 nm, satisfactory crystallinity can not be obtained. Also, when the film thickness is larger than 150 nm, the disconnection of an interconnection line formed over the active region is more likely to occur at the edge portion of the active region. A film thickness of about 100 nm is preferable. In order to introduce the catalyst elements having a concentration in the above-mentioned range into an a-Si film with this thickness, the implant dose during the ion implantation is required to be in the range of $1 \times 10^{11}$ to $1 \times 10^{14}$ atoms/cm$^3$.

In performing the above-mentioned crystallization method using the catalyst elements, the most effective results can be obtained by using Ni as a catalyst element. Examples of other usable catalyst elements include Co, Pd, Pt, Cu, Ag, Au, In, Sn, Al and Sb. If at least one catalyst element is introduced from the above-cited group, then even a very small amount (a concentration in the film of $1 \times 10^{16}$ atoms/cm$^3$ or higher) of such elements remarkably promotes the crystallization. Therefore, there is no need for worrying about the adverse effects over the semiconductor device.

A semiconductor device according to the invention includes: an active region constituted by a crystalline silicon film formed on an insulating surface of the substrate and an insulating thin-film formed on the active region. The active region contains the catalyst elements for promoting the crystallization of the amorphous silicon film by a heat treatment. The crystalline silicon film constituting the active region to be obtained by crystallizing the amorphous silicon film can exhibit even higher crystallinity than the crystallinity to be obtained by a generally used solid-phase growth method. Since the crystallinity of the active region is satisfactory, by keeping clean the interface between the active region and the insulating film continuously formed thereon, the defect level in the interface can be effectively reduced.

The crystallization of the amorphous silicon film by the heat treatment is promoted by the catalyst elements, so that a high-quality crystalline silicon film can be formed with a satisfactory reproducibility. Since the heating temperature required for the crystallization is 580° C. or lower, an inexpensive glass substrate such as Corning 7059 glass substrate can be used.

A semiconductor device according to the present invention includes: a first insulating thin-film formed on a substrate; an active region, having a crystallinity, formed on the first insulating thin-film; and a second insulating thin-film formed on the active region. The active region contains the catalyst elements for promoting the crystallization of the amorphous silicon film by performing a heat treatment. By continuously growing the first insulating thin-film, the active region and the second insulating thin-film; the properties of the interface between the first insulating thin-film and the active region and the interface between the second insulating thin-film and the active region can be remarkably improved. Moreover, the crystalline silicon film constituting the active region can be formed with a satisfactory reproducibility by crystallizing the amorphous silicon film. The crystallization of the amorphous silicon film can be performed at such a low temperature that an inexpensive glass substrate can be used.

By irradiating a laser beam or an intense light beam onto the crystalline silicon film obtained by heat-treating the amorphous silicon film, the crystallinity of the silicon film constituting the active region can be further improved; thereby even increasing the field-effect mobility of the carriers in the active region.

By using the insulating thin-film as a gate insulating film for an MOS transistor, the leak current of the transistor can be reduced.

By setting the concentration of the catalyst elements in the active region of the film to be in the range of $1 \times 10^{16}$ to $1 \times 10^{19}$ atoms/cm$^3$, the catalyst elements can function more effectively.

According to a method for producing a semiconductor device of the invention, the amorphous silicon film and the insulating thin-film are continuously formed on a substrate having an insulating surface region, in a state where the atmosphere is shut off. Therefore, the interface between these films can be kept clean.

According to a method of the invention, the catalyst elements for promoting the crystallization of the amorphous silicon film are introduced through the insulating thin-film into the amorphous silicon film by an ion implantation method. The amorphous silicon film to which the catalyst elements are introduced is then crystallized by performing a heat-treatment. Thus a high-quality crystalline silicon film, having an even higher crystallinity than the crystallinity to be obtained by a generally used solid-phase growth method, can be formed with a satisfactory reproducibility.

According to the invention, the heating temperature required for the crystallization can be set to be 580° C. or lower so that an inexpensive glass substrate such as Corning 7059 glass substrate can be used.

According to the invention, after crystallizing the amorphous silicon film to which the catalyst elements are introduced by performing a heat-treatment, the crystals are treated by irradiating a laser beam or an intense light beam onto the crystallized silicon film. The crystallinity of the crystalline silicon film constituting the active region can thereby be improved, further increasing the field-effect mobility of the carriers in the active region.

According to a method for producing a semiconductor device of the invention, the three layers of the first insulating thin-film, the amorphous silicon film and the second insulating thin-film can be continuously formed on the substrate in a state where the atmosphere is shut off. The properties of the interface between the first insulating thin-film and the amorphous silicon film and the interface between the second insulating thin-film and the amorphous silicon film can thereby be improved.

Hereinafter, the present invention will be described by way of illustrative examples with reference to the accompanying drawings.

EXAMPLE 1

FIGS. 1A to 1E are cross-sectional views showing a thin-film transistor (TFT) and a method for producing the same according to a first example of the invention. FIGS. 1A to 1E sequentially illustrate the respective steps for producing the TFT according to this first example of the invention.

As shown in FIGS. 1A to 1E, a semiconductor device 100 includes a TFT 10 which is formed on a glass substrate 101 via an insulating underlying film 102 such as a silicon oxide film. An island-shaped crystalline silicon film 103b for constituting the TFT 10 is formed on the insulating underlying film 102. The crystalline silicon film 103b includes a channel region 108 in the central portion thereof; and a source region 109 and a drain region 110 on respective sides of the channel region 108. An aluminum gate electrode 106 is provided over the channel region 108 via a gate insulating film 104. The surface of the gate electrode 106 is covered with an oxide layer 107. The entire surface of the TFT 10 is covered with an interlevel insulating film 111. Contact holes 111a are formed in the portions of the interlevel insulating film 111 corresponding to the source region 109 and the drain region 110, respectively. The source region 109 and the drain region 110 are connected to electrode lines 112 and 113 through these contact holes 111a.

In this first example, the crystalline silicon film 103b contains a catalyst element (Ni) for promoting the crystallization of the amorphous silicon film by a heat treatment and is composed of needle-like crystals or column-like crystals where the crystal grains are substantially in a single crystalline state.

The TFT 10 of this example can be used not only as a driver circuit for an active-matrix type liquid crystal display device and a device constituting the pixel portions, but also as a device for constituting a central processing unit (CPU) formed on the same substrate having these circuits and the pixel portions thereon. The TFT is applicable to a so-called thin-film integrated circuit as well as a liquid crystal display device.

Next, a method for producing the TFT will be described. In this example, the steps for producing an N-type TFT on the glass substrate will be described in detail below.

First, an underlying film 102 made of silicon oxide having a thickness of about 200 nm is formed on the glass substrate 101 by a sputtering technique or the like. This silicon oxide film is provided for preventing the impurities from diffusing from the glass substrate 101.

Second, as shown in FIG. 1A, an intrinsic (type I) amorphous silicon film (a-Si film) 103 having a thickness in the range of 25 to 100 nm, e.g., 80 nm, is grown. A silicon oxide film having a thickness in the range of 20 to 150 nm, e.g., 100 nm, is continuously formed as a gate insulating film 104 without exposing the amorphous silicon film to the atmosphere. By continuously forming the semiconductor layer and the gate insulating film without exposing these films to the atmosphere, the semiconductor layer/gate insulating film interface can be kept clean, thereby improving the reliability and the performance of the TFT to be formed.

In order to form continuously the semiconductor layer and the insulating film without exposing these layers to the atmosphere, a plasma CVD method is most commonly used. A sputtering method, a photo induced CVD method or an electron beam evaporation method can also be used. In this example, an a-Si film and a silicon oxide film are continuously formed by an RF plasma CVD method. The a-Si film is formed by decomposing and depositing silane ($SiH_4$) to be used as a source gas by heating the substrate at a temperature of 150° to 400° C., preferably in the range of 200° to 300° C. The silicon oxide film is formed by decomposing and depositing tetra ethoxy silane (TEOS) to be used as a source gas with oxygen by heating the substrate at a temperature of 150° to 600° C., more preferably in the range of 300° to 450° C. TEOS is an organic material, which is in a liquid state at an ambient temperature, containing Si atoms, O atoms and the like. TEOS can be used for forming an interlevel insulating film and the like, thereby allowing for obtaining an insulating film excellent in a step coverage.

Figure 1B:
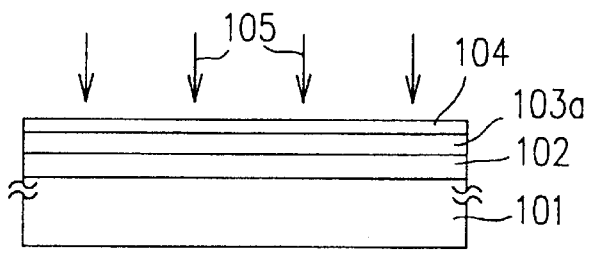

Then, as shown in FIG. 1B, nickel ions 105 are implanted through the gate insulating film 104 into the a-Si film 103 by an ion implantation method. The implant dose of nickel can be set to be in the range of $1 \times 10^{11}$ to $1 \times 10^{14}$ atoms/$cm^2$. In this example, the nickel ions 105 are implanted into the a-Si film 103 by setting the accelerating voltage of the nickel ions to be in the range of 120 to 200 keV, e.g., 160 keV, and the implant dose to be $1 \times 10^{13}$ atoms/$cm^2$. Then, the ion implanted film is annealed to be crystallized at a temperature of 520° to 580° C. for several to several tens of hours, e.g., at 550° C. for four hours in this example, under a hydrogen-reduction environment or an inactive environment. In this case, the nickel ions 105 implanted into the a-Si film function as crystal nuclei, and then nickel functions as a catalyst, thereby effectively promoting the crystallization of the a-Si film 103. Thus a crystalline silicon film 103a is formed. Simultaneously, nickel diffuses uniformly inside the film, so that the concentration of nickel in the crystalline silicon film 103a becomes $1.2 \times 10^{18}$ atoms/$cm^3$.

Figure 1C:
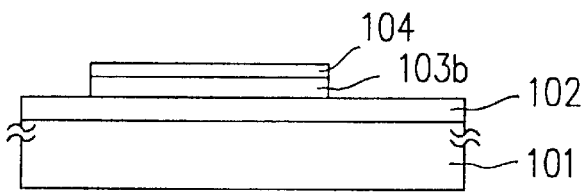

As shown in FIG. 1C, the unnecessary portions of the crystalline silicon film 103a are removed so as to isolate the respective TFTs, thereby forming an island-shaped crystalline silicon film 103b to be used as an active region (the source, drain and channel regions) for a TFT. Simultaneously, the silicon oxide film 104 formed on the crystalline silicon film 103a is patterned in the same shape as that of the island-shaped crystalline silicon film 103b.

Thereafter, aluminum is deposited by a sputtering technique on the silicon oxide film 104 so as to have a thickness of 400 to 800 nm, e.g., 600 nm. The aluminum film is then patterned so as to form a gate electrode 106. The surface of this aluminum gate electrode 106 is anodized, thereby forming an oxide layer 107, as shown in FIG. 1D.

In this case, the anodization is conducted in an ethylene-glycol solution containing 1 to 5% tartaric acid by initially supplying a constant current so as to increase the voltage up to 220 V and then by maintaining the state for an hour, thereby completing the treatment. The thickness of the oxide layer 107 is 200 nm. Since the thickness of the oxide layer 107 defines a length of an offset gate region during a subsequent ion doping step, the length of the offset gate region is controlled by the anodization step.

Next, using the gate electrode 106 and the oxide layer 107 covering the gate electrode 106 as masks, the active region 103b (or the crystalline silicon film) is doped with an impurity (phosphorus) by an ion doping method. Phosphine ($PH_3$) is used as a doping gas, the accelerating voltage is set to be in the range of 60 to 90 kV, e.g., 80 kV, and the implant dose is set to be $1 \times 10^{15}$ to $8 \times 10^{15}$ $cm^{-2}$, e.g., $2 \times 10^{15}$ $cm^{-2}$. By performing this step, the impurity-doped regions 109 and 110 will be used as the source and drain regions for the TFT 10, respectively, and the undoped region 108 being masked by the gate electrode 106 and the surrounding oxide layer 107 will be used as the channel region for the TFT 10.

Figure 1D:
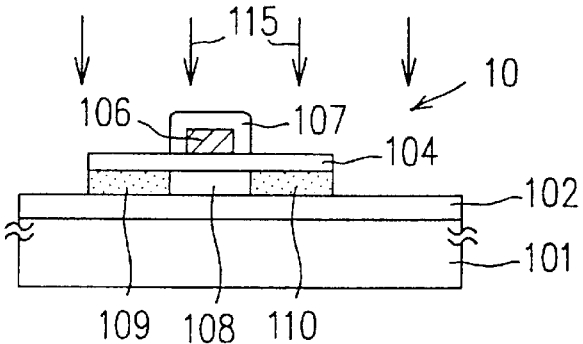

As shown in FIG. 1D, the annealing is then conducted by the irradiation of the laser beam 115, thereby activating the doped impurity and improving the deteriorated crystallinity of the doped portions. In this irradiation step, a KrF excimer laser (wavelength: 248 nm and pulse width: 20 nsec) is irradiated at the energy density of 150 to 400 mJ/cm$^2$, more preferably in the range of 200 to 250 mJ/cm$^2$. The sheet resistance of the N-type impurity (phosphorus) regions 109 and 110 thus formed is in the range of 200 to 800 Ω/☐.

A silicon oxide film or a silicon nitride film having a thickness of about 600 nm is then formed as an interlevel insulating film 111. If a silicon oxide film is formed using TEOS as a source material, by a plasma CVD method using oxygen, or by a low-pressure CVD method or an atmospheric-pressure CVD method using ozone, then a satisfactory interlevel insulating film excellent in a step coverage can be obtained. If a silicon nitride film is grown using SiH$_4$ and NH$_3$ as source gases by the plasma CVD method, then the dangling bonds are terminated by hydrogen atoms supplied to the active region/gate insulating film interface, and the deterioration of the properties of a TFT can be advantageously suppressed.

Figure 1E:
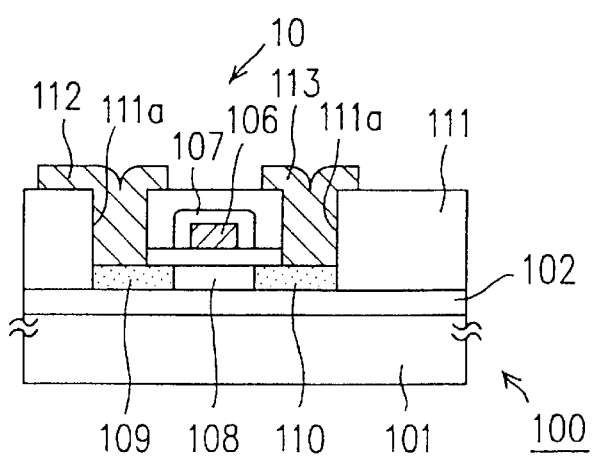

Contact holes 111a are then formed in the interlevel insulating film 111, thereby forming the electrode lines 112 and 113 for a TFT by using a double-layered film made of titanium nitride and aluminum. The titanium nitride film functions as a barrier film for preventing aluminum from diffusing into the source and drain regions. As shown in FIG. 1E, the annealing is conducted under a hydrogen environment at one atmospheric pressure at 350° C. for 30 minutes, thereby completing the TFT 10.

Where the TFT thus obtained is used as a switching element for a pixel electrode, one of the electrode lines 112 and 113 is connected to the pixel electrode formed by a transparent conductive film made of indium tin oxide (ITO) and a signal is input from the other electrode. In the case where the TFT is used for a thin-film integrated circuit, it is required to form a contact hole on the gate electrode 106 and to provide necessary lines.

In the TFT produced according to this example, satisfactory characteristics can be obtained: the field-effect mobility is in the range of 60 to 80 cm$^2$/Vs; the S value is in the range of 0.6 to 0.8 V/digit; and the threshold voltage is in the range of 2 to 3 V. The S value is a rising coefficient in the sub-threshold region of the TFT which indicates the inclination of the plot where the drain current ID abruptly rises in a graph showing the relationship between the gate voltage VG and the drain current ID by the variation of the gate voltage when the drain current ID increases by one digit. The deviation of the TFT characteristics inside the substrate is within a range of ±12% in the field-effect mobility and ±8% in the threshold voltage.

As described above, the amorphous silicon film 103 and the insulating thin-film 104 are continuously formed on a substrate whose surface region has insulating properties, so that the interface between these films can be kept clean.

The catalyst element (Ni) for promoting the crystallization of the amorphous silicon film is implanted through the insulating thin-film into the amorphous silicon film by an ion implantation method. The amorphous silicon film to which the catalyst element is implanted is then crystallized by a heat treatment. Thus a high-quality crystalline silicon film 103b, having an even higher crystallinity as compared with the crystallinity to be obtained by a generally used solid-phase growth method, can be formed with a satisfactory reproducibility.

Moreover, since the crystallinity of the crystalline silicon film 103b is satisfactory, by keeping clean the interface between the amorphous silicon film 103 and the gate insulating film 104, the defect level in the interface can be effectively reduced.

The heating temperature required for this crystallization can be set to be 580° C. or lower, so that an inexpensive glass substrate such as Corning 7059 glass substrate can be used.

The silicon oxide film on the crystalline silicon film 103b is used as a gate insulating film for an MOS transistor, so that the leak current of the transistor can be reduced.

Since the concentration of the catalyst element inside the crystalline silicon film is set to be 1×10$^{16}$ to 1×10$^{19}$ atoms/cm$^3$, the catalyst element can function more effectively.

EXAMPLE 2

FIGS. 2A to 2E are cross-sectional views showing a thin-film transistor (TFT) and a method for producing the same according to a second example of the invention. FIGS. 2A to 2E sequentially illustrate the respective steps for producing the TFT according to this second example of the invention.

As shown in FIGS. 2A to 2E, a semiconductor device 200 of this example includes a circuit 20 having a complementary metal-oxide-semiconductor (CMOS) structure for constituting a peripheral driver circuit for an active matrix type liquid crystal display device or a generally used thin-film integrated circuit. This circuit 20 having a CMOS structure is obtained by connecting an N-type TFT 21 and a P-type TFT 22 so that these two TFTs 21 and 22 operate complimentarily.

The N-type TFT 21 and the P-type TFT 22 are formed respectively on the glass substrate 201 via an insulating underlying film 202 such as a silicon oxide film. Two island-shaped crystalline silicon films 203n and 203p for constituting the TFTs 21 and 22 are formed on the insulating underlying film 202 so as to be adjacent to each other. These crystalline silicon films 203n and 203p include an N-type channel region 208 and a P-type channel region 209 in the central portions thereof. An N-type source region 210 and an N-type drain region 211 for the N-type TFT are formed on the right and left sides of the crystalline silicon film 203n. A P-type source region 212 and a P-type drain region 213 for the P-type TFT are formed on the right and left sides of the crystalline silicon film 203p.

Two aluminum gate electrodes 206 and 207 are provided over the N-type channel region 208 and the P-type channel region 209 via a gate insulating film 204. The entire surfaces of the TFTs 21 and 22 are covered with an interlevel insulating film 214. Contact holes 214n are formed in the portions of the interlevel insulating film 214 corresponding to the source region 210 and the drain region 211 of the N-type TFT 21 while contact holes 214p are formed in the portions of the interlevel insulating film 214 corresponding to the source region 212 and the drain region 213 of the P-type TFT 22. The source region 210 and the drain region 211 of the N-type TFT 21 are connected to electrode lines 215 and 216 through these contact holes 214n, while the source region 212 and the drain region 213 of the P-type TFT 22 are connected to electrode lines 216 and 217 through these contact holes 214p.

In this second example, the crystalline silicon films 203n and 203p contain a catalyst element (Ni) for promoting the crystallization of the amorphous silicon film by a heat treatment and are composed of needle-like crystals or column-like crystals where the crystal grains are substantially in a single crystalline state.

Next, a method for producing the circuit will be described. The steps for producing the circuit having the above-described CMOS structure on the glass substrate will be described in detail below.

Figure 2A:
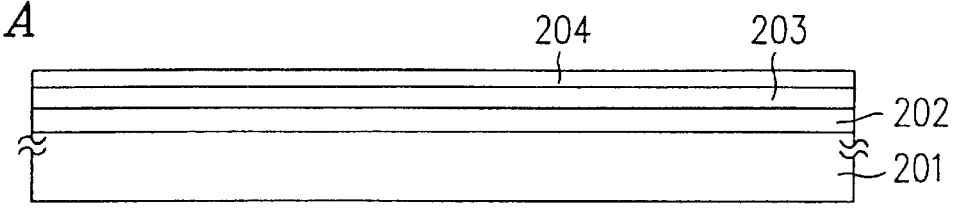
FIGS. 2A to 2E are cross-sectional views illustrating a configuration of a TFT and a production method thereof according to a second example of the invention.

First, an underlying film 202 made of silicon oxide having a thickness of about 100 nm is formed on the glass substrate 201 by a sputtering technique or the like. Then, as shown in FIG. 2A, an intrinsic (type I) amorphous silicon film (a-Si film) 203 having a thickness in the range of 25 to 100 nm, e.g., 50 nm, and a silicon oxide film 204 having a thickness in the range of 20 to 150 nm, e.g., 100 nm, are continuously formed by a plasma CVD method.

Figure 2B:
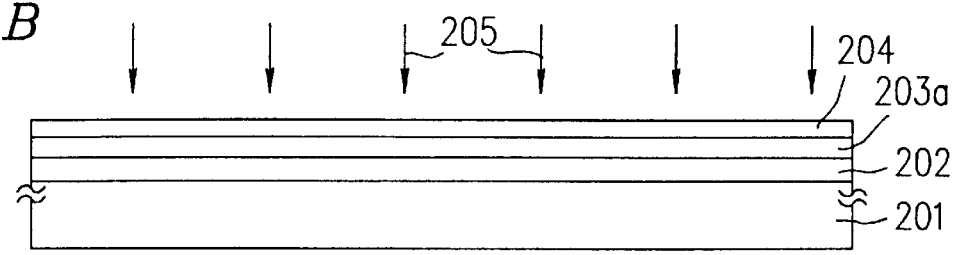

As shown in FIG. 2B, nickel ions 205 are then implanted through the gate insulating film 204 into the a-Si film 203 by an ion implantation method. In this case, the implant dose of nickel is set to be in the range of $5 \times 10^{12}$ atoms/cm$^2$ and the accelerating voltage of the nickel ions is set to be 140 keV. The ion implanted film is then annealed at a temperature of 520° to 580° C. for several to several tens of hours, e.g., at 550° C. for six hours in this example, under a hydrogen-reduction environment or an inactive environment so as to be crystallized.

The nickel ions 205 implanted into the a-Si film function as crystal nuclei, and then nickel functions as catalyst for effectively promoting the crystallization of the a-Si film 203. As a result, the a-Si film 203 becomes a crystalline silicon film 203a. The concentration of nickel inside the crystalline silicon film 203a becomes $1 \times 10^{18}$ atoms/cm$^3$.

A laser beam is then irradiated onto the crystalline silicon film, thereby improving the crystallinity of the crystalline silicon film 203a. In this example, an XeCl excimer laser (wavelength: 308 nm, pulse width: 40 nsec) is used. The laser beam heats the substrate at a temperature in the range of 200° to 450° C., e.g., 400° C., and by using the energy density in the range of 200 to 400 mJ/cm$^2$, e.g., 300 mJ/cm$^2$.

Figure 2C:
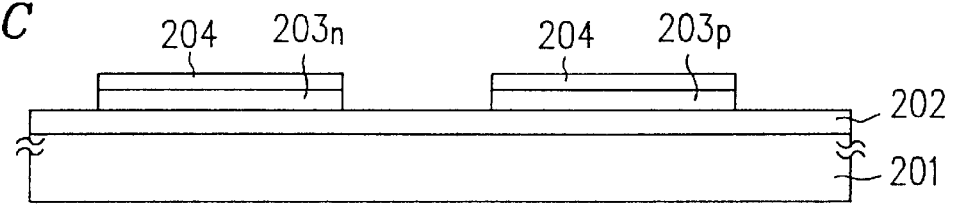

As shown in FIG. 2C, the unnecessary portions of the crystalline silicon film 203a, other than the portions to be used as the active regions (or the device regions) 203n and 203p for the TFTs, are then removed by an etching technique so as to isolate the respective TFTs. Simultaneously, the silicon oxide film 204 formed on the crystalline silicon film 203a is patterned in the same shape as those of the island-shaped crystalline silicon films 203n and 203p.

Figure 2D:
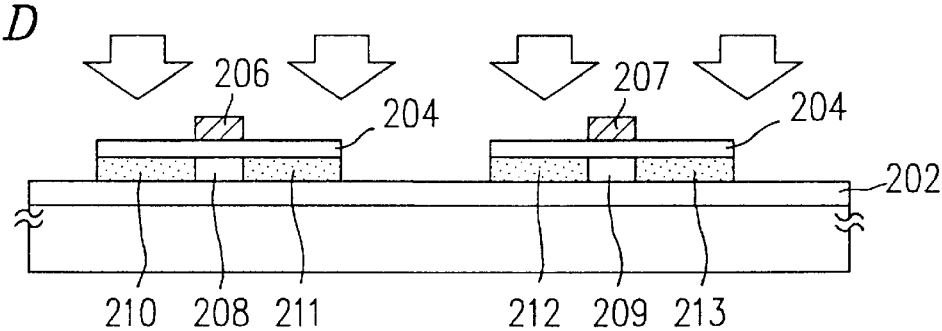

Next, as shown in FIG. 2D, aluminum (containing 0.1 to 2% silicon) is deposited by a sputtering technique on the silicon oxide film 204 so as to have a thickness of 400 to 800 nm, e.g., 500 nm. Then, the aluminum film is patterned so as to form gate electrodes 206 and 207.

Using the gate electrodes 206 and 207 as masking layers for the active regions 203n and 203p, respectively, the active region 203n is then doped with an impurity (phosphorus) and the active region 203p is doped with another impurity (boron). In this case, phosphine (PH$_3$) and diborane (B$_2$H$_6$) are used as doping gases; the accelerating voltage for doping phosphorus is set to be in the range of 60 to 90 kV, e.g., 80 kV, and the accelerating voltage for doping boron is set to be in the range of 40 to 80 kV, e.g., 65 kV; and the implant dose is set to be in the range of $1 \times 10^{15}$ to $8 \times 10^{15}$ cm$^{-2}$, e.g., $2 \times 10^{15}$ cm$^{-2}$ for phosphorus and $5 \times 10^{15}$ cm$^{-2}$ for boron.

By performing this step, the regions which are not doped with the impurities being masked by the gate electrodes 206 and 207 will be used as the channel regions 208 and 209 for the TFTs 21 and 22. When performing the doping, the respective elements are selectively doped by masking the regions with photoresists which are not to be doped. As a result, N-type impurity regions 210 and 211 and P-type impurity regions 212 and 213 are formed, thereby forming the N-channel type TFT (or N-type TFT) 21 and the P-channel type TFT (or P-type TFT) 22 as shown in FIG. 2D.

As shown in FIG. 2D, the annealing is conducted by the irradiation of the laser beam, thereby activating the doped impurity. In this irradiation step, an XeCl excimer laser (wavelength: 308 nm and pulse width: 40 nsec) is irradiated at the energy density of 250 mJ/cm$^2$. The irradiation is conducted by focusing two pulses of the laser beam on each scanning position.

Figure 2E:
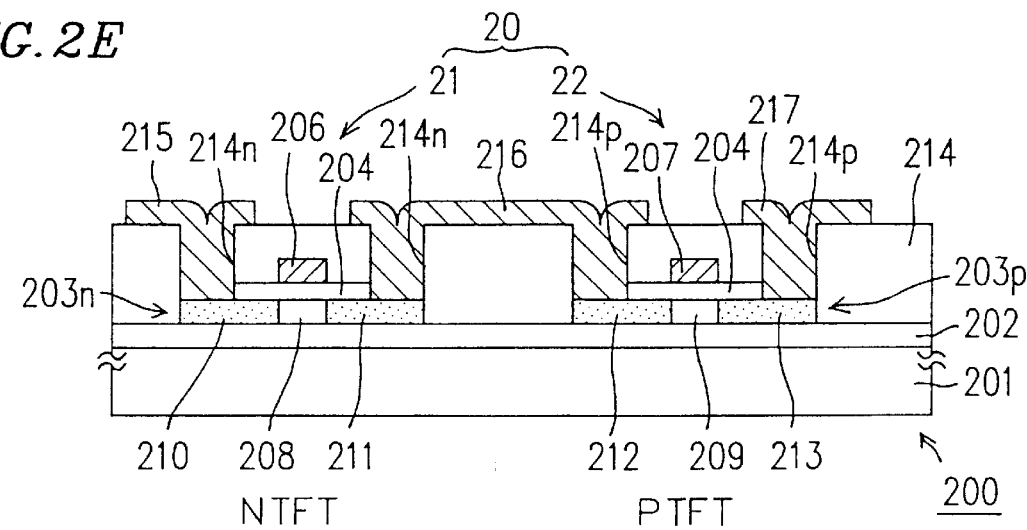

As shown in FIG. 2E, a silicon oxide film having a thickness of 600 nm is then formed by a plasma CVD method as an interlevel insulating film 214. The contact holes 214n and 214p are formed in the interlevel insulating film 214, thereby forming the electrode lines 215, 216 and 217 for the TFTs using a double-layered film made of titanium nitride and aluminum. Finally, the annealing is performed at 350° C. for 30 minutes in a hydrogen environment at one atmospheric pressure, thereby completing the N-type TFT 21 and the P-type TFT 22.

In the circuit having a CMOS structure produced by the above-described method of this example, the N-type TFT 21 and the P-type TFT 22 have high field-effect mobilities of 120 to 150 cm$^2$/Vs and 100 to 130 cm$^2$/Vs, respectively, and have the threshold voltages of 1.5 to 2 V and −2 to −3 V, respectively. Therefore, these TFTs exhibit very satisfactory characteristics.

According to the method of this example, the crystalline silicon film obtained by heat-treating the amorphous silicon film is further treated by the irradiation of a laser beam or an intense light beam, so that the improvement of the crystallinity of the silicon film constituting the active regions and the improvement of the field-effect mobility of the carriers in the active region can be further realized, in addition to the effects described in the first example.

EXAMPLE 3

FIGS. 3A to 3E are cross-sectional views showing a thin-film transistor (TFT) and a method for producing the same according to a third example of the invention. FIGS. 3A to 3E sequentially illustrate the respective steps for producing the TFT according to this third example of the invention.

As shown in FIGS. 3A to 3E, a semiconductor device 300 includes a TFT 30 having completely the same cross-sectional structure as that of the TFT 10 of the semiconductor device according to the first example of the invention. The TFT 30 of the third example is different from the TFT 10 of the first example in that a silicon oxide film to be used as an underlying insulating film 302; a semiconductor layer 303 to be used as an active region; and a silicon oxide film 303 to be used as a gate insulating film are continuously formed without being exposed to the atmosphere. It is noted that the components of this example having reference numerals in the three hundreds shown in FIG. 3 correspond to the components of the first example having reference numerals in the hundreds shown in FIG. 1.

Next, a method for producing the TFT 30 will be described. In this example, the steps for producing an N-type TFT 30 on the glass substrate will also be described in detail below.

Figure 3A:
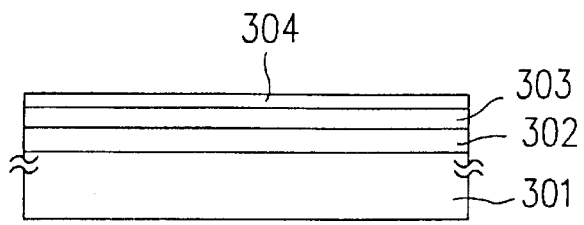
FIGS. 3A to 3E are cross-sectional views illustrating a configuration of a TFT and a production method thereof according to a third example of the invention.

First, as shown in FIG. 3A, an underlying film 302 made of silicon oxide having a thickness of 100 to 300 nm, e.g., 200 nm; an intrinsic (type I) amorphous silicon film (a-Si film) 303 having a thickness in the range of 25 to 100 nm, e.g., 80 nm; and a silicon oxide film having a thickness in the range of 20 to 150 nm, e.g., 100 nm, to be used as a gate insulating film 304 are continuously formed on the glass substrate 301 without being exposed to the atmosphere. By continuously forming the underlying insulating film, the semiconductor layer and the gate insulating film in this way, the underlying insulating film and the semiconductor layer interface and the semiconductor layer/gate insulating film interface can be kept clean.

The continuous formation of the semiconductor layer and the gate insulating film improves the characteristics when the TFT is turned ON, e.g., the reliability and the performance of the TFT to be completed later. The continuous formation of the underlying insulating film and the semiconductor layer improves the characteristics when the TFT is turned OFF, e.g., the reduction of the leak current.

In this example, the silicon oxide film, the a-Si film and the silicon oxide film are continuously formed by an RF plasma CVD method. The a-Si film is formed by decomposing and depositing silane ($SiH_4$) gas to be used as a source gas by heating the substrate at a temperature of 150° to 400° C., more preferably in the range of 200° to 300° C. The silicon oxide films, i.e., both the underlying insulating film and the gate insulating film, are formed by decomposing and depositing tetra ethoxy silane (TEOS) to be used as a source gas with oxygen by heating the substrate at a temperature of 150° to 600° C., more preferably in the range of 300° to 450° C. The underlying silicon oxide film 302 also functions as a buffer layer for preventing the impurity from diffusing from the glass substrate.

Figure 3B:
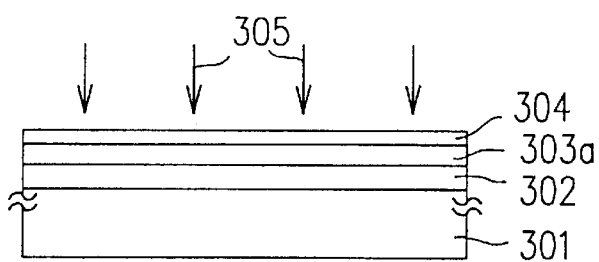

As shown in FIG. 3B, nickel ions 305 are then implanted through the gate insulating film 304 into the a-Si film 304 by an ion implantation method. In this example, the implant dose of nickel is set to be in the range of $1 \times 10^{11}$ to $1 \times 10^{14}$ atoms/cm². The accelerating voltage of the nickel ions is set to be in the range of 120 to 200 keV, e.g., 160 keV, and the implant dose to be $1 \times 10^{13}$ atoms/cm². Then, the ion implanted film is annealed at a temperature of 520° to 580° C. for several to several tens of hours, e.g., at 550° C. for four hours in this example, under a hydrogen-reduction environment or an inactive environment so as to be crystallized. In this case, the nickel ions 305 implanted into the a-Si film function as crystal nuclei, and then nickel functions as a catalyst, thereby effectively promoting the crystallization of the a-Si film 303. As a result, the a-Si film 303 becomes a crystalline silicon film 303a. At the same time, nickel diffuses uniformly inside the film, so that the concentration of nickel inside the crystalline silicon film 303a becomes $1.2 \times 10^{18}$ atoms/cm³.

Figure 3C:
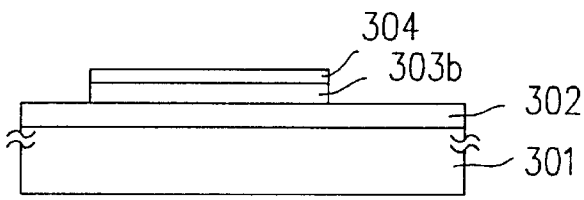

As shown in FIG. 3C, the unnecessary portions of the crystalline silicon film 303a are then removed so as to isolate the respective TFTs, thereby forming an island-shaped crystalline silicon film 303b to be used as an active region (the source, drain and channel regions) for the TFT. At the same time, the silicon oxide film 304 formed on the crystalline silicon film 303a is patterned in the same shape as that of the island-shaped crystalline silicon film 303b.

Figure 3D:
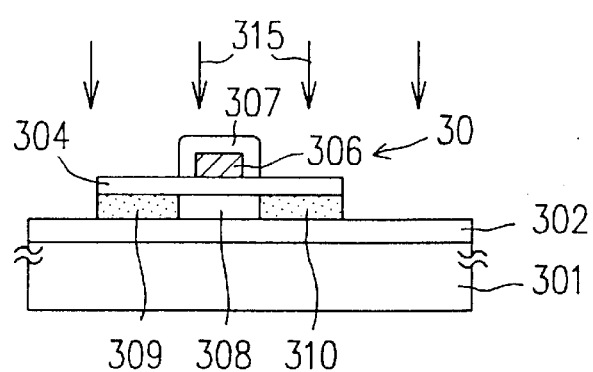

Thereafter, aluminum is deposited by a sputtering technique on the silicon oxide film 304 so as to have a thickness of 400 to 800 nm, e.g., 600 nm. The aluminum film is then patterned so as to form a gate electrode 306. The surface of this aluminum gate electrode 306 is anodized to form an oxide layer 307, as shown in FIG. 3D. In this case, the anodization is conducted in an ethylene-glycol solution containing 1 to 5% tartaric acid by initially supplying a constant current so as to increase the voltage up to 220 V and then by maintaining the state for an hour, thereby completing the treatment. The thickness of the resulting oxide layer 307 is 200 nm. Since the thickness of the oxide layer 307 will be used as a length of an offset gate region during a subsequent ion doping step, the length of the offset gate region can be determined during the anodization step.

Next, using the gate electrode 306 and the oxide layer 307 covering the gate electrode 306 as masks, the active region is doped with an impurity (phosphorus) by an ion doping method. Phosphine ($PH_3$) is used as a doping gas, the accelerating voltage is set to be in the range of 60 to 90 kV, e.g., 80 kV, and the implant dose is set to be $1 \times 10^{15}$ to $8 \times 10^{15}$ cm⁻², e.g., $2 \times 10^{15}$ cm⁻².

By performing this step, the impurity-doped regions 309 and 310 will be used as the source and drain regions for the TFT 30, respectively, and the impurity-undoped region 308 being masked by the gate electrode 306 and the surrounding oxide layer 307 will be used as the channel region for the TFT 30.

As shown in FIG. 3D, the annealing is then conducted by the irradiation of the laser beam 315, thereby activating the doped impurity and at the same time improving the deteriorated crystallinity of the portions doped with the impurity. In this irradiation step, a KrF excimer laser (wavelength: 248 nm and pulse width: 20 nsec) is irradiated at the energy density of 150 to 400 mJ/cm², more preferably in the range of 200 to 250 mJ/cm². The sheet resistance of the N-type impurity (phosphorus) regions 309 and 310 is in the range of 200 to 800 $\Omega/\square$.

A silicon oxide film or a silicon nitride film having a thickness of about 600 nm is then formed as an interlevel insulating film 311. If a silicon oxide film is formed using TEOS as a source material by a plasma CVD method using oxygen, or by a low-pressure CVD method or an atmospheric-pressure CVD method using ozone, then a satisfactory interlevel insulating film excellent in a step coverage can be obtained. If a silicon nitride film is grown using $SiH_4$ and $NH_3$ as source gases by the plasma CVD method, then the dangling bonds are terminated by hydrogen atoms supplied to the active region/gate insulating film interface, and the deterioration of the properties of a TFT can be suppressed.

Figure 3E:
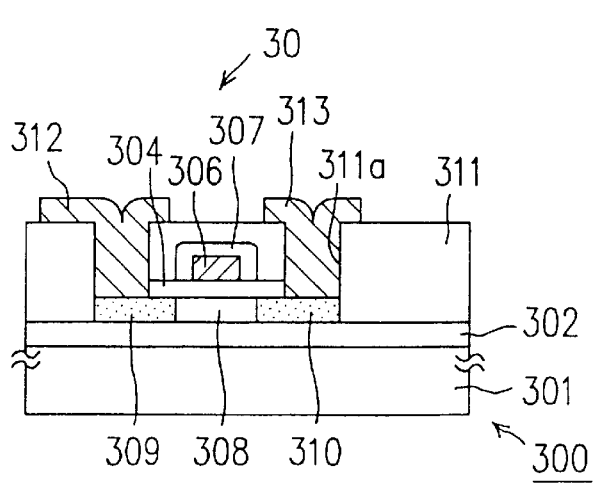

Next, contact holes 311a are formed in the interlevel insulating film 311, thereby forming the electrode lines 312 and 313 for a TFT by using a multi-layered film made of metal materials such as titanium nitride and aluminum. The annealing is then conducted at a temperature of 350° C. for 30 minutes under a hydrogen environment at one atmospheric pressure, thereby completing the TFT 30 as shown in FIG. 3E.

In the case where the TFT 30 thus obtained is used as a switching element for pixel electrodes, one of the electrode lines 312 and 313 is connected to the pixel electrode formed by a transparent conductive film made of indium tin oxide (ITO) and a signal is input from the other electrode. In the case where the TFT 30 is used for a thin-film integrated circuit, it is required to form a contact hole on the gate electrode 306 and to provide necessary lines.

In the N-type TFT 30 thus produced according to this method, satisfactory characteristics can be obtained: the field-effect mobility is in the range of 60 to 80 cm²/Vs; the S value is in the range of 0.6 to 0.8 V/digit; and the threshold voltage is in the range of 2 to 3 V. The deviation of the TFT characteristics inside the substrate is within a range of ±12% in the field-effect mobility and ±8% in the threshold voltage. The leak current causing various problems can be uniformly reduced by one digit, i.e., in the range of 2 to $6 \times 10^{-12}$ A/cm², as compared with a TFT where the underlying insulating film and the semiconductor layer are not continuously formed.

According to the method of the third example, by continuously forming the underlying insulating film, the semiconductor layer and the gate insulating film, not only the improvement of the ON characteristics but also the reduction of the leak current in the OFF region can be realized.

In the above detailed description, the present invention has been described by way of the three examples in which catalyst element is introduced through an insulating film. However, the present invention is not limited to the above-described three examples, but various modifications can be made based on the technological spirit of the invention.

For example, nickel is used as the catalyst element for promoting the crystallization of the amorphous silicon film in the above-described three examples. In place of nickel, the same effects can be attained by using cobalt, palladium, platinum, copper, silver, gold, indium, tin, antimony, or aluminum.

In the second example, heat treatment is conducted by irradiating an excimer laser (or pulse laser) beam in order to promote the crystallinity of the crystalline silicon film. Other kinds of laser beams (e.g., a continuously oscillating Ar laser beam) can also be used for conducting a similar heat treatment.

In addition, a so-called rapid thermal annealing (RTA) or a rapid thermal process (RTP) for heating a sample up to a temperature of 1000° to 1200° C. (i.e., the temperature of a silicon monitor) in a short period of time by using an intense light emitted from an infrared light and a flash lamp can also be utilized.

The crystallization method discovered by the present inventors is applicable for the improvement of the properties in the semiconductor/gate insulating film interface considerably effecting the operation of an MOS transistor. By realizing a satisfactory crystallinity of the semiconductor layer and satisfactory interface characteristics between the semiconductor layer and the insulating thin-film, much effect can be attained and the performance of the resulting TFT can be remarkably improved. In addition, the semiconductor layer, i.e., the silicon oxide film, can be produced at a low temperature of 580° C. or lower, so that the method of the invention is particularly effective in realizing a higher performance of a thin-film transistor to be formed on a glass substrate.

The present invention is applicable to various devices other than an active-matrix substrate for a liquid crystal display. For example, the invention is applicable to various devices such as a close-contact type image sensor, a driver-monolithic thermal head, a driver-monolithic optical write device or display device using organic electroluminescent (EL) elements as light-emitting elements, and a semiconductor device such as a three-dimensional IC. The organic electroluminescent (EL) elements herein refer to field-effect light-emitting elements using organic materials as the light-emitting materials. In the case of applying the present invention to these devices, high-performance characteristics such as a fast response and a high resolution can be realized for these devices. Furthermore, the present invention is broadly applicable not only to a thin-film transistor described in the above-described examples, but also to a semiconductor process in general utilizing an MOS transistor.

In the above-described examples, when the catalyst element is selectively added to the amorphous silicon film, the catalyst element is also added to the surface of the masking insulating thin-film. Accordingly, the properties of the insulating thin-film possibly deteriorate. Hereinafter, it will be described a method for forming a semiconductor device in which, after adding the catalyst element, the insulating thin-film is partially etched away from a surface to a predetermined depth so as to remove the region where the catalyst element has diffused and to utilize the remaining insulating thin-film, as a method for solving the deterioration problem of the insulating thin film. In the case of producing a semiconductor layer and a gate insulating film for a TFT by using such a method, the field-effect mobility of the TFT can be increased twice or more as compared with that of a TFT obtained by a generally used solid-phase growth method, and the threshold voltage thereof can be much stabilized.

In the case of producing a TFT by performing a step for promoting the crystallinity of a laterally crystallized region by the irradiation of a laser beam or an intense light beam, the field-effect mobility of the resulting TFT can be increased four times or more as compared with that of a TFT obtained by a generally used solid-phase growth method, and the deviation of the TFT characteristics within a substrate, which has been a serious problem occurring in the case of producing an active region only by a laser crystallization, can be suppressed to a negligible level. Moreover, if the masks for introducing the catalyst element are not removed completely but utilized for the production process, the process can be simplified.

During a step for uniformly etching away a portion of the insulating thin-film from the surface thereof until a predetermined depth, it is preferable to set the depth of the insulating thin-film to be etched away to be equal to or larger than the diffusion distance of the catalyst element in the insulating thin-film during the heat-treatment for the crystallization of the amorphous silicon film.

As a result, the concentration of the catalyst element contained in the insulating film can be reduced to substantially zero. In such a case, the thickness of the insulating thin-film to be first grown is required to be set to be larger beforehand as compared with the ultimate desired thickness, in view of the thickness of the portion to be removed during a subsequent step.

As an alternative method, a method for preventing the catalyst element from diffusing in the insulating thin-film during the heat-treatment for crystallizing the amorphous silicon film by forming a diffusion barrier film against the catalyst element on the insulating thin-film after continuously forming the amorphous silicon film and the insulating thin-film on the substrate can be used. By using the insulating thin-film and the diffusion barrier film as masks, the catalyst element is selectively introduced into the amorphous silicon film. Since unnecessary catalyst element is trapped in the diffusion barrier film, the unnecessary (or not contributing to the crystal growth of the amorphous silicon film) catalyst element can be eliminated by removing the diffusion barrier film after laterally crystallizing the amorphous silicon film in a direction parallel to the surface of the substrate. In the case of producing a TFT by the use of such a method, a TFT having the same performance can be obtained as that of the TFT obtained by the above-described method. In addition, in the same way as the above-described case, remarkable effects can be attained by irradiating a laser beam or an intense light beam.

In such a case, the thickness of the diffusion barrier film is preferably set to be equal to or larger than the diffusion distance of the catalyst element in the diffusion barrier film during the heat treatment for the crystallization of the amorphous silicon film. As a result, the concentration of the catalyst element contained in the insulating film can be reduced to substantially zero. Any film can be used as the diffusion barrier film, so long as the film has a diffusion coefficient of the catalyst element smaller than that in the silicon film. However, in view of the effects to be given to the silicon film, it is most preferable to use a silicide film such as a silicon oxide film or a silicon nitride film. When using such a film, the diffusion coefficient of the catalyst element is a thousandth or less as compared with that in the amorphous silicon film, so no problem occurs. In the case of using a silicon oxide film as the insulating thin-film; by using a silicon nitride film as the diffusion barrier film, a sufficient etching selectivity can be obtained between the silicon oxide film and the silicon nitride film during the removal of the diffusion barrier film. Therefore, it is possible to set easily the thickness of the insulating thin-film to be used for the process as compared with the above-described method.

In the above-described two production methods developed by the present inventors, the catalyst element can be introduced by an ion implantation, a very small amount of catalyst element can be introduced by forming a super-thin film by a sputtering technique, or added by a plasma processing. The plasma processing is a method for adding a catalyst element to the amorphous silicon film using a plasma CVD apparatus in which the electrode is made of a material containing a catalyst element and plasma is generated under a nitrogen or a hydrogen ambient gas. In the case of introducing the catalyst element into the amorphous silicon film by these methods, the catalyst element has already penetrated into a considerable depth of the amorphous silicon film before conducting the heat-treatment, and simultaneously, the catalyst element has penetrated into a considerable depth of the insulating thin-film serving as a mask. In order to use an insulating thin-film serving as a mask during one process as a part of the device during a subsequent process, it is important to introduce the catalyst element only into an extremely thin surface region of the amorphous silicon film, and the insulating thin-film or the diffusion barrier film. Therefore, the above-described method for introducing the catalyst element can not be regarded as an optimal one.

Because of the foregoing reasons, in order to introduce the catalyst element, a method for applying a solution or a compound where the catalyst element is dissolved or dispersed onto the entire surface of the substrate so as to be in contact with the amorphous silicon film; or a method for depositing a super-thin film made of the catalyst element on the entire surface of the substrate can be effectively utilized. According to these methods, the catalyst element is introduced only into a superficial portion of the amorphous silicon film, and the insulating thin-film or the diffusion barrier film, so the catalyst element is not introduced deeper into the film. Accordingly, a large amount of catalyst element is not introduced into the insulating thin-film, and the catalyst element in the insulating thin-film can be removed easily by the above-described production method. Consequently, the objectives of the invention are accomplished.

The concentration of the catalyst element to be introduced into the amorphous silicon film is desired to be as low as possible. If the concentration is too low, the catalyst element no longer functions so as to promote the crystallization of the amorphous silicon film. According to the measurement results obtained by the present inventors, the minimum concentration of the catalyst element where the crystallization still occurs is $1 \times 10^{16}$ atoms/cm$^3$. If the concentration is lower than this value, the crystal growth no longer occurs even if the catalyst element is added.

If the concentration of the catalyst element is high, then the catalyst element adversely affects the device. The increase of the leak current mainly in the OFF region of the TFT is an exemplary phenomenon occurring when the concentration of the catalyst element is high. This phenomenon is presumably caused by a tunnel current owing to the level of the impurities formed by the catalyst element in the silicon film. According to the results obtained by the present inventors, the maximum concentration of the catalyst element where the device is not adversely affected by the catalyst element is $1 \times 10^{19}$ atoms/cm$^3$. If the concentration of the catalyst element in the film is in the range of $1 \times 10^{16}$ to $1 \times 10^{19}$ atoms/cm$^3$, then the catalyst element functions most effectively.

In performing the above-mentioned crystallization method using the catalyst element discovered by the present inventors, the most remarkable effects can be obtained by using Ni as a catalyst element. Examples of other usable catalyst elements include Co, Pd, Pt, Cu, Ag, Au, In, Sn, Sb and Al. If at least one catalyst element is introduced by selecting from the above-cited group, then even a very small amount of such elements remarkably promote the crystallization. Therefore, there is no need for worrying about the adverse effects over the semiconductor device.

Hereinafter, exemplary production methods of the invention allowing for eliminating the effects of the catalyst element will be described in detail below.

EXAMPLE 4

Figure 4A:
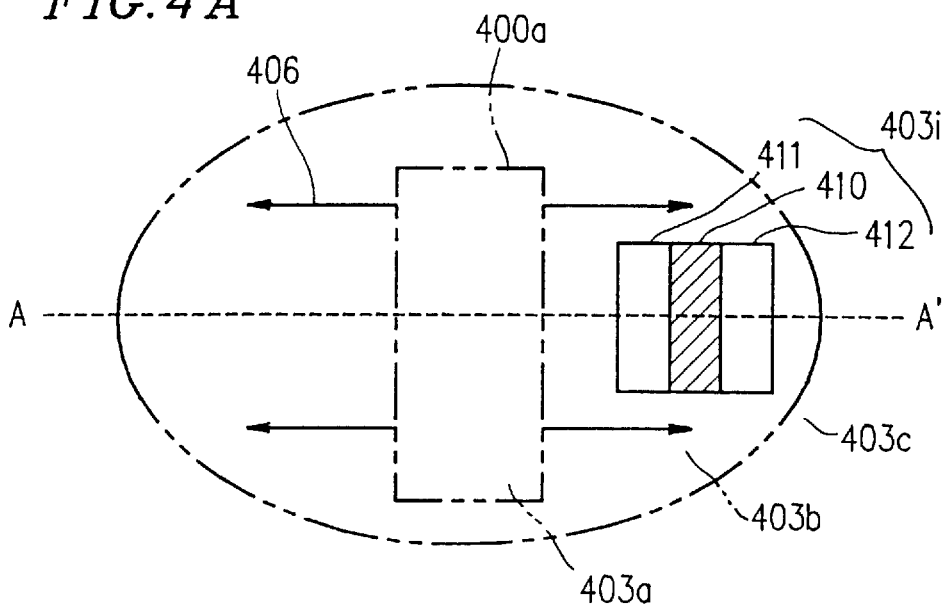
FIGS. 4A and 4B are plan views illustrating a configuration of a semiconductor device and a production method thereof according to a fourth example of the invention.
Figure 4B:
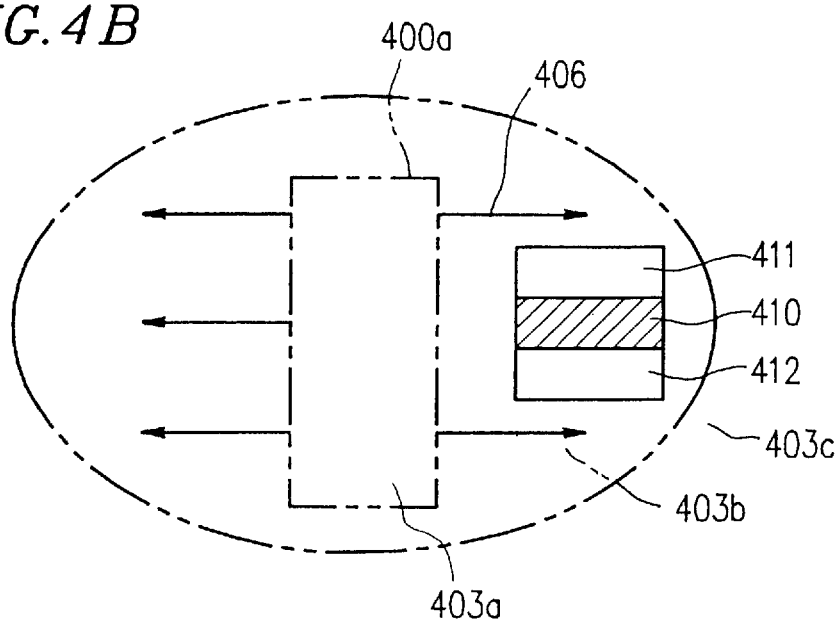

FIGS. 4A and 4B are plan views illustrating a thin-film transistor (TFT) and a method for producing the same according to the first example of the invention. FIGS. 5A to 5F are cross-sectional views taken along the line A–A' in FIG. 4A sequentially showing the production steps of the TFT according to the fourth example of the invention.

As shown in FIGS. 5A to 5F, a semiconductor device 400 includes an N-type TFT 40 which is formed on a glass substrate 401 via an insulating underlying film 402 such as a silicon oxide film. An island-shaped crystalline silicon film 403$i$ for constituting the TFT 40 is formed on the insulating underlying film 402. The crystalline silicon film 403$i$ includes a channel region 410 in the central portion thereof; and a source region 411 and a drain region 412 on both sides of the channel region 410. An aluminum gate electrode 408 is provided over the channel region 410 via a gate insulating film 404. The surface of the gate electrode 408 is covered with an oxide layer 409. The entire surface of the TFT 40 is covered with an interlevel insulating film 413. Contact holes 413$a$ are formed in the portions of the interlevel insulating film 413 corresponding to the source region 411 and the drain region 412, respectively. The source region 411 and the drain region 412 are connected to electrode lines 414 and 415 through these contact holes 413$a$.

In this example, the crystalline silicon film 403$i$ is a part of a laterally crystallized region 403$b$ formed by the crystallization in a direction parallel to the surface of the substrate from the crystallized silicon region 403$a$ in the vicinity of the crystalline silicon film 403$i$. The crystallized silicon region 403$a$ and the laterally crystallized region 403$b$ contain a catalyst element (Ni) for promoting the crystallization of the amorphous silicon film by the heat-treatment and are composed of needle-like crystals or column-like crystals where the crystal grains are substantially in a single crystalline state.

The TFT 40 of this example can be used not only as a driver circuit for an active-matrix type liquid crystal display device and a device constituting the pixel portions, but also as a device for constituting a central processing unit (CPU) formed on the same substrate having these circuits and the pixel portions thereon. The TFT is applicable to a so-called thin-film integrated circuit as well as a liquid crystal display device.

Next, a method for producing the TFT will be described. In this example, the steps for producing an N-type TFT 40 on the glass substrate will be described in detail below.

An underlying film 402 made of silicon oxide having a thickness of about 200 nm is formed on the glass substrate 401 by a sputtering technique or the like. This silicon oxide film is provided for preventing an impurity diffusion from the glass substrate 401.

Figure 5A:
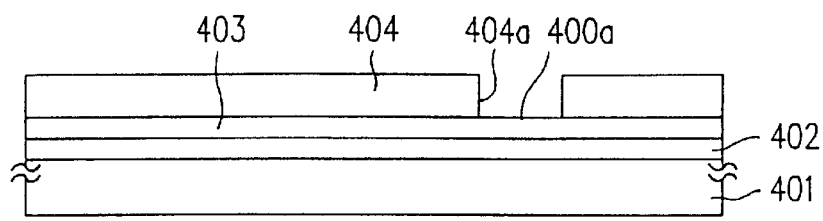
FIGS. 5A to 5F are cross-sectional views sequentially showing the production steps of the semiconductor device according to the fourth example of the invention.

As shown in FIG. 5A, an intrinsic (type I) amorphous silicon film (a-Si film) 403 having a thickness in the range of 25 to 100 nm, e.g., 80 nm, is then grown, and a silicon oxide film 404 having a thickness of 200 nm, is continuously formed within a closed chamber. By continuously forming the semiconductor layer and the insulating film without breaking the vacuum in this way, the semiconductor layer/gate insulating film interface can be kept clean, thereby improving the reliability and the performance of the TFT to be formed. In order to form continuously the semiconductor layer and the insulating film without exposing these layers to the atmosphere, a plasma CVD method is most commonly used, for example. A sputtering method, a photo induced CVD method or an electron beam evaporation method can also be used.

In this example, an a-Si film and a silicon oxide film are continuously formed by an RF plasma CVD method. The a-Si film is formed by decomposing and depositing silane ($SiH_4$) to be used as a source gas by heating the substrate at a temperature of 150° to 400° C., more preferably in the range of 200° to 300° C. The silicon oxide film is formed by decomposing and depositing tetra ethoxy silane (TEOS) to be used as a source gas with oxygen by heating the substrate at a temperature of 150° to 600° C., more preferably in the range of 300° to 450° C. TEOS is an organic material, which is in a liquid state at an ambient temperature, containing Si atoms and O atoms. TEOS can be used for forming an interlevel insulating film and the like, thereby allowing an insulating film excellent in a step coverage.

A through hole 404a is then formed at a desired position of the silicon oxide film 404, thereby exposing the a-Si film 403 in a slit shape. That is to say, when the substrate in a state as shown in FIG. 5A is viewed from above, the a-Si film 403 is exposed in the region 400a in a slit shape through a through hole 404a of the silicon oxide film 404, while the remaining portion of the a-Si film 403 is still masked. In this example, as shown in FIG. 4A, the TFT 40 is produced so that the source region 411 and the drain region 412 are disposed in parallel with the lateral crystal growth direction 406. Alternatively, as shown in FIG. 4B, the TFT 40 can be produced so that the source region 411 and the drain region 412 are disposed so as to be vertical to the lateral crystal growth direction 406.

Figure 5B:
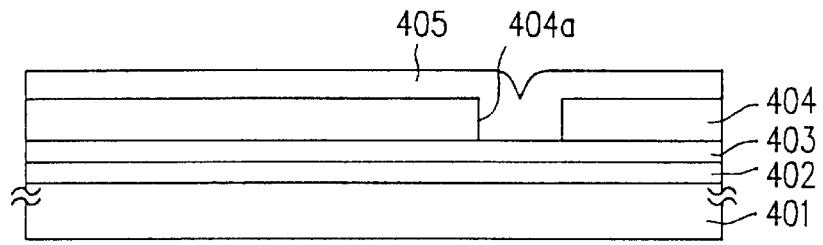
Figure 5C:
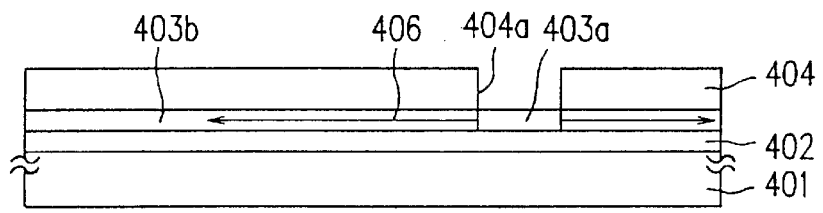

As shown in FIG. 5B, a nickel-based aqueous solution 405 containing nickel acetate, nickel nitrate or the like is then applied over the entire surface of the substrate and then dried uniformly by a spinner. In this case, the concentration of nickel in the aqueous solution is suitably in the range of 50 to 200 ppm, preferably 100 ppm. In the region 400a, precipitated Ni ions are in contact with the a-Si film 403, and therefore a small amount of nickel has already been added selectively into the region 400a. This region 400a is then annealed at a temperature of 520° to 580° C. for several to several tens of hours, e.g., at 550° C. for 16 hours, under a hydrogen reduction environment (the partial pressure of hydrogen is preferably in the range of 0.1 to 1 pressure) or an inactive environment (atmospheric pressure), so as to be crystallized.

In this case, the amorphous silicon film 403 is crystallized in the region 400a to which a small amount of nickel has been added in a direction vertical to the substrate 401, so that a crystalline silicon film 403a is formed. Then, as indicated by the arrow 406 shown in FIGS. 4A and 5C, the crystals are growing from the region 400a to the regions surrounding the crystallized region 403a in a lateral direction (or the direction parallel to the substrate), so that a laterally crystallized crystalline silicon film 403b is formed. The other regions of the amorphous silicon film remain the amorphous silicon film 403c. When the crystals are growing, the distance of the crystal growth in a direction parallel to the substrate as indicated by the arrow 406 is approximately 80 $\mu$m. The concentration of nickel in the region 403a crystallized by directly adding a small amount of nickel is $1 \times 10^{18}$ cm$^{-3}$, while the concentration of nickel in the laterally crystallized region 403b is approximately $5 \times 10^{16}$ cm$^{-3}$.

Next, a predetermined portion of the surface of the silicon oxide film 404 is etched away. The thickness of the portion to be etched away is preferably equal to or larger than the diffusion thickness of nickel from the surface of the silicon oxide film 404 during the heat treatment. In this example, by using 1:10 buffered fluorine (BHF) as an etchant, the silicon oxide film 404 is etched away from the surface to the depth of 100 nm. Accordingly, the thickness of the remaining silicon oxide film 404 becomes 100 nm, where substantially no metal element (nickel of this example) causing considerable deterioration of the properties of the insulating film exists. By performing the above-described steps, it becomes possible to reuse the silicon oxide film 404 used as a making film when the catalyst element (nickel) was selectively added as a gate insulating film 407.

Figure 5D:
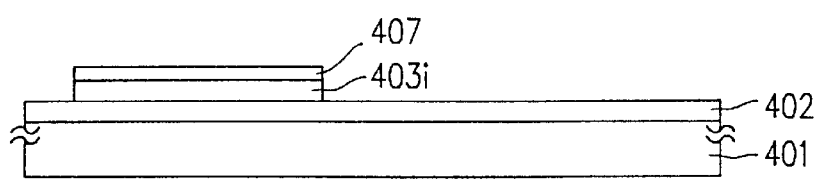

As shown in FIG. 5D, the unnecessary portions of the silicon film 403 are then removed so as to isolate the respective TFTs, thereby forming an island-shaped crystalline silicon film 403i to be used as an active region (the source, drain and channel regions). At the same time, the silicon oxide film 407 (or the gate insulating film) formed on the silicon film 403b is patterned in the same shape as that of the island-shaped crystalline silicon film 403i.

Figure 5E:
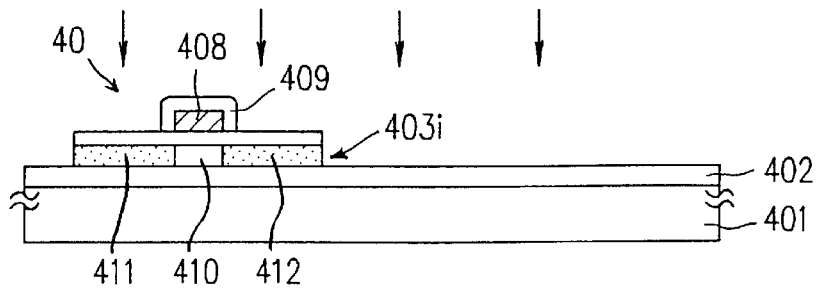

Aluminum is then deposited by a sputtering technique on the silicon oxide film 407 so as to have a thickness of 400 to 800 nm, e.g., 600 nm. The aluminum film is then patterned so as to form a gate electrode 408. The surface of this aluminum gate electrode 408 is anodized; forming an oxide layer 409, as shown in FIG. 5E. In this case, the anodization is conducted in an ethyleneglycol solution containing 1 to 5% tartaric acid by initially supplying a constant current so as to increase the voltage up to 220 V and then by maintaining the state for an hour, thereby completing the treatment. The thickness of the resulting oxide layer 409 is 200 nm. Since the thickness of the oxide layer 409 will be used as a length of an offset gate region during a subsequent ion doping step, the length of the offset gate region can be determined beforehand during the anodization step.

Using the gate electrode 408 and the oxide layer 409 covering the gate electrode 408 as a mask, the active region is then doped with an impurity (phosphorus) by an ion doping method. Phosphine ($PH_3$) is used as a doping gas, the accelerating voltage is set to be in the range of 60 to 90 kV, e.g., 80 kV, and the implant dose is set to be $1\times10^{15}$ to $8\times10^{15}$ cm$^{-2}$, e.g., $2\times10^{15}$ cm$^{-2}$. By performing this step, the impurity-doped regions 411 and 412 will be used as the source and drain regions for the TFT 40, respectively, and the impurity-undoped region 410 being masked by the gate electrode 408 and the surrounding oxide layer 409 will be used as the channel region for the TFT 40.

As shown in FIG. 5E, the annealing is then conducted by the irradiation of the laser beam, thereby activating the doped impurity and improving the deteriorated crystallinity of the portions doped with the impurity. In this irradiation step, an XeCl excimer laser (wavelength: 308 nm and pulse width: 40 nsec) is irradiated at the energy density of 150 to 400 mJ/cm$^2$, more preferably in the range of 200 to 250 mJ/cm$^2$. The sheet resistance of the N-type impurity (phosphorus) regions 411 and 412 is in the range of 200 to 800 $\Omega/\square$.

A silicon oxide film or a silicon nitride film having a thickness of about 600 nm is then formed as an interlevel insulating film 413. If a silicon oxide film is formed using TEOS as a source material by a plasma CVD method using oxygen, or by a low-pressure CVD method or an atmospheric-pressure CVD method using ozone, a satisfactory interlevel insulating film excellent in a step coverage can be obtained. If a silicon nitride film is grown using $SiH_4$ and $NH_3$ as source gases by the plasma CVD method, then the dangling bonds are terminated by hydrogen atoms supplied to the active region/gate insulating film interface, and the deterioration of the properties of a TFT can be advantageously suppressed.

Figure 5F:
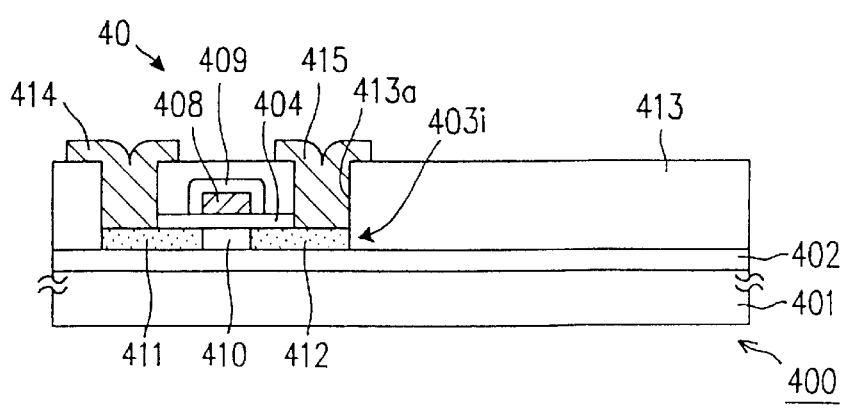

Contact holes 413a are then formed in the interlevel insulating film 413; forming the electrode lines 414 and 415 for a TFT by using a double-layered film made of titanium nitride and aluminum. The titanium nitride film functions as a barrier film for preventing aluminum from diffusing into the semiconductor layer. Finally, the annealing is conducted at 350° C. for 30 minutes under a hydrogen environment at one atmospheric pressure, thereby completing the TFT 10 as shown in FIG. 5F.

In the case where the TFT thus obtained is used as a switching element for pixel electrodes, one of the electrode lines 414 and 415 is connected to the pixel electrode formed by a transparent conductive film made of indium tin oxide (ITO) and a signal is input from the other electrode. On the other hand, in the case where the TFT is used for a thin-film integrated circuit, it is required to form a contact hole on the gate electrode 408 and to provide necessary lines.

In the N-type TFT thus produced according to this example, satisfactory characteristics can be obtained: the field-effect mobility is in the range of 100 to 130 cm$^2$/Vs and the threshold voltage is in the range of 1 to 2 V. The deviation of the TFT characteristics inside the substrate is within a range of ±12% in the field-effect mobility and ±8% in the threshold voltage.

According to this example of the invention, the amorphous silicon film 403 and the silicon oxide film 404 are continuously formed on the silicon oxide film 402 on the surface of the substrate 401 without breaking the vacuum, so that the interface between these films can be kept clean.

In addition, the catalyst element for promoting the crystallization of the amorphous silicon film is partially introduced into the amorphous silicon film 403. The region of the amorphous silicon film to which the catalyst element is introduced is then crystallized by a heat treatment, so that this region 403a can be turned from an amorphous region into a polycrystalline region by a low temperature treatment. By continuously performing the low temperature treatment, the crystallized region can be further extended laterally in a direction parallel to the surface of the substrate so as to form a laterally crystallized region 403b to be used as an active region 430i.

The crystalline silicon film thus obtained by crystallizing the amorphous silicon film can exhibit an even higher crystallinity than the crystallinity to be obtained by a generally used solid-phase growth method.

In this case, the heating temperature required for the crystallization can be set to be 580° C. or lower, so that an inexpensive glass substrate such as Corning 7059 glass substrate can be used.

The silicon oxide film 407 on the laterally crystallized region 403b is used as a gate insulating film for an MOS transistor, so that the leak current of the transistor can be reduced.

Since the concentration of the catalyst element inside the region 403a of the amorphous silicon film to which the catalyst element is introduced is set to be $1\times10^{16}$ to $1\times10^{19}$ atoms/cm$^3$, the catalyst element can function more effectively.

EXAMPLE 5

Figure 6A:
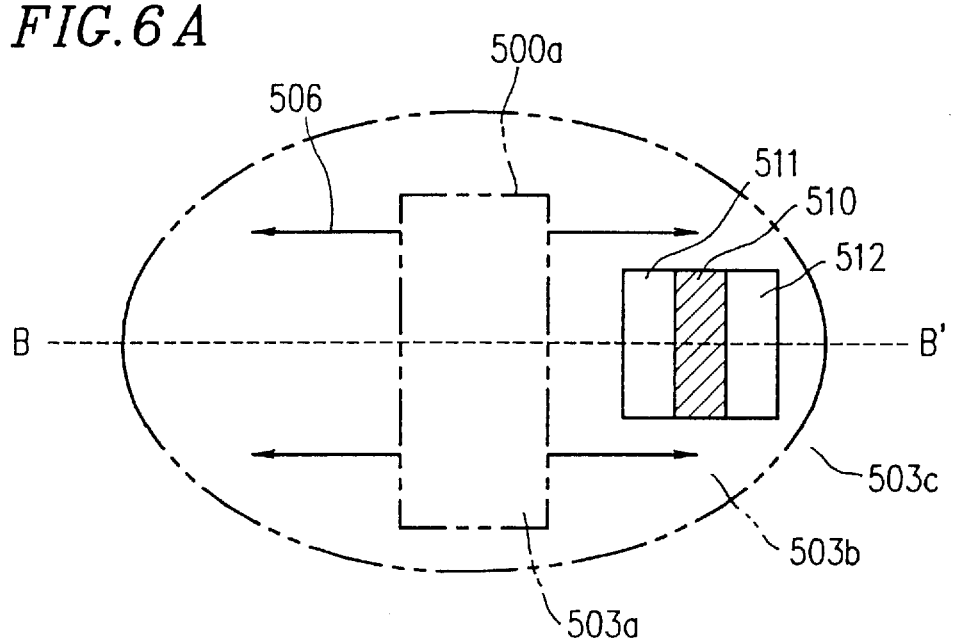
FIGS. 6A and 6B are plan views illustrating a configuration of a semiconductor device and a production method thereof according to a fifth example of the invention.
Figure 6B:
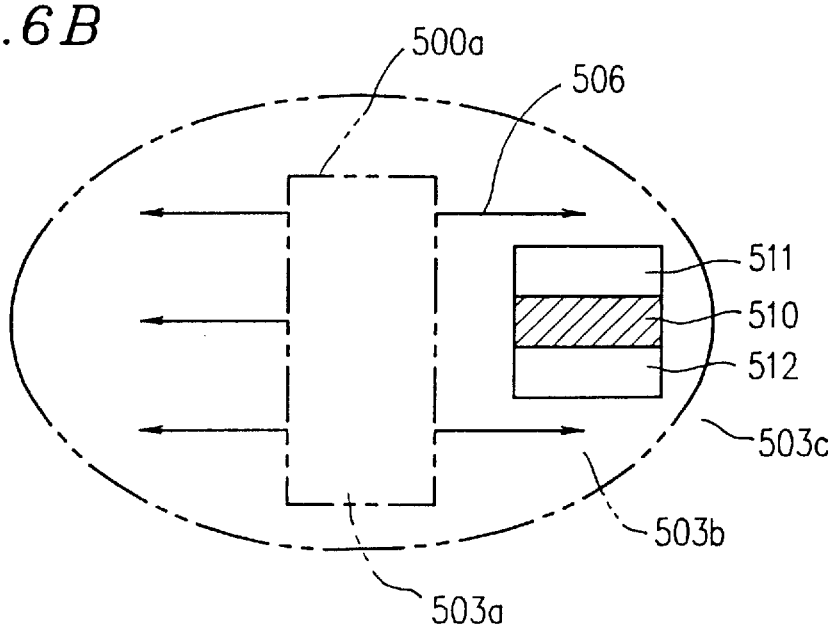

FIGS. 6A and 6B are plan views illustrating a thin-film transistor and a method for producing the same according to a fifth example of the present invention. FIGS. 7A to 7F are cross-sectional views taken along the line B–B' in FIG. 6A sequentially illustrating the respective steps for producing the TFT according to this third example of the invention.

As shown in FIGS. 7A to 7F, a semiconductor device 500 includes a P-type TFT 50 having completely the same cross-sectional structure as that of the N-type TFT 40 in the semiconductor device according to the fourth example of the invention. It is noted that the components of this example having reference numerals in the five hundreds shown in FIGS. 6A and 6B and FIGS. 7A to 7F correspond to the components of the fourth example having reference numerals in the four hundreds shown in FIGS. 5A to 5F except for the diffusion barrier film 504 constituted by a silicon nitride film.

Figure 7A:
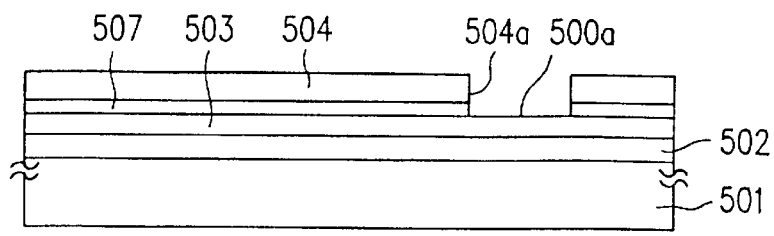
FIGS. 7A to 7F are cross-sectional views sequentially showing the production steps of the semiconductor device according to the fifth example of the invention.

First, an underlying film 502 made of silicon oxide having a thickness of about 200 nm is formed on the glass substrate 501 by a sputtering technique or the like. As shown in FIG. 7A, an intrinsic (type I) amorphous silicon film (a-Si film) 503 having a thickness in the range of 25 to 100 nm, e.g., 50 nm; and a silicon oxide film 507 having a thickness in the range of 20 to 150 nm, e.g., 100 nm are then continuously formed in the vacuum without being exposed to the atmosphere.

In this example, the a-Si film and the silicon oxide film are continuously formed by an RF plasma CVD method. The a-Si film is formed by decomposing and depositing silane ($SiH_4$) gas to be used as a source gas by heating the substrate at a temperature of 150° to 400° C., more preferably in the range of 200° to 300° C. The silicon oxide film is formed by decomposing and depositing tetra ethoxy silane (TEOS) to be used as a source gas with oxygen by heating the substrate at a temperature of 150° to 600° C., more preferably in the range of 300° to 450° C.

A silicon nitride film 504 having a thickness of 200 nm is then deposited over the entire surface of the substrate so as to cover the silicon oxide film. This film 504 is grown using a mixture of SiH$_4$, NH$_3$ and N$_2$ as a source gas by an RF plasma CVD method. The silicon nitride film 504 functions as a barrier film against the catalyst element to be used for the subsequent crystallization step of the a-Si film, and prevents the catalyst element from diffusing into the silicon oxide film 507. The thickness of this silicon nitride film 504 is preferably equal to or larger than the diffusion distance of the catalyst element into the silicon nitride film during the heat treatment for crystallizing the a-Si film.

Next, a through hole 504a is formed through the silicon oxide film 507 and the silicon nitride film 504, thereby exposing the a-Si film 503 in a slit shape through the hole 504a. That is to say, when the substrate in a state as shown in FIG. 7A is viewed from above, the a-Si film 503 is exposed in a slit shape in the region 500a, while the remaining portion of the a-Si film 503 is still masked by the silicon oxide film 507 and the silicon nitride film 504.

As shown in FIG. 6A, the TFT 50 is produced so that the source region 511 and the drain region 512 are disposed in parallel to the lateral crystal growth direction 506. Alternatively, as shown in FIG. 6B, the TFT 50 can be produced so that the source region 511 and the drain region 512 are disposed so as to be vertical to the lateral crystal growth direction 506.

Figure 7B:
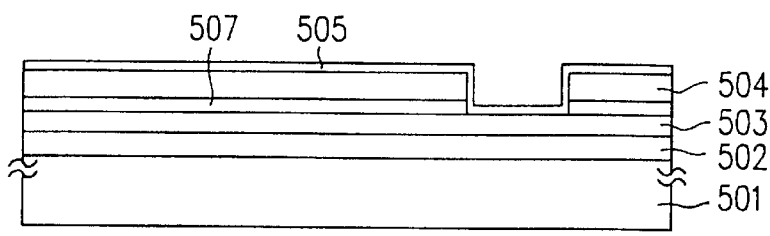
Figure 7C:
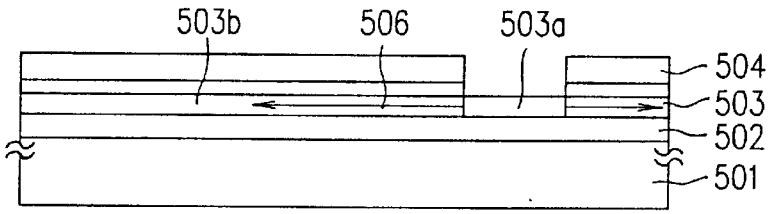

As shown in FIG. 7B, a super-thin nickel film 505 is grown by a deposition method. This nickel film is too thin a film to be seen with the eyes, and the amount of the deposition is controlled by the surface density of nickel. In this example, the surface density of nickel to be deposited is set to be $2\times10^{13}$ cm$^{-2}$. This super-thin nickel film 505 is annealed at a temperature of 520° to 580° C. for several to several tens of hours, e.g., 550° C. for 16 hours, under a hydrogen or an inactive ambient gas so as to be crystallized.

In this case, the crystallization of the silicon film 503 is crystallized in the region 500a to which a small amount of nickel has been added in a direction vertical to the substrate 501, so that a crystalline silicon film 503a is formed. As indicated by the arrow 506 shown in FIG. 7C, the crystals then grow from the region 500a to the regions surrounding the crystallized region 500a in a lateral direction (or the direction parallel to the substrate) so that a laterally crystallized crystalline silicon film 503b is formed. The other regions of the amorphous silicon film remain the amorphous silicon film 503c. When the crystals are growing, the distance of the crystal growth in a direction parallel to the substrate as indicated by the arrow 506 is approximately 80 μm. The concentration of nickel in the region 503a crystallized by directly adding a small amount of nickel is $4\times10^{18}$ cm$^{-3}$, while the concentration of nickel in the laterally crystallized region 503b is approximately $1\times10^{17}$ cm$^{-3}$.

Figure 7D:
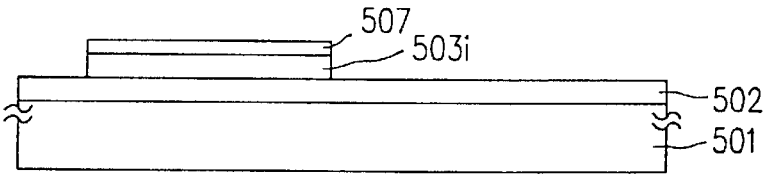

The silicon nitride film 504 and the unnecessary portions of the crystalline silicon film 503 are then removed so as to isolate the respective TFTs. Simultaneously, the silicon oxide film 507 formed on the silicon film 503 is patterned in the same shape as that of the island-shaped crystalline silicon film 503i. By performing these steps, the island-shaped crystalline silicon film 503i to be used as the active region (the source, drain and channel regions) for the TFT is formed (FIG. 7D). During the previous step, the silicon nitride film 504 functions as a barrier film against the catalyst element (nickel of this example), thereby preventing the catalyst element from diffusing into the silicon oxide film 507. Therefore, substantially no catalyst element causing the deterioration of the insulation properties exists in the silicon oxide film 507, so the silicon oxide film 507 can be used as a gate insulating film.

Aluminum is then deposited by a sputtering technique on the silicon oxide film 507 so as to have a thickness of 400 nm. Then, the aluminum film is patterned so as to form a gate electrode 508. Using the gate electrode 508 as a mask, the active region is then doped with an impurity (boron) by an ion doping method. Diborane (B$_2$H$_6$) is used as a doping gas, the accelerating voltage is set to be in the range of 40 to 80 kV, e.g., 65 kV, and the implant dose is set to be $1\times10^{15}$ to $8\times10^{15}$ cm$^{-2}$, e.g., $5\times10^{15}$ cm$^{-2}$. By performing this step, the impurity-doped regions 511 and 512 will be used as the source and drain regions for the TFT 50, respectively, and the impurity-undoped region 510 being masked by the gate electrode 508 will be used as the channel region for the TFT 50.

Figure 7E:
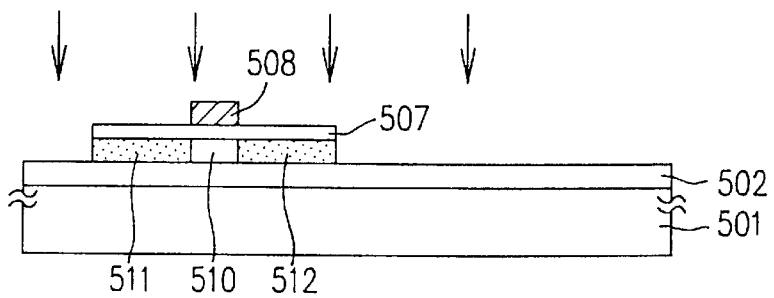

As shown in FIG. 7E, the annealing is conducted by the irradiation of the laser beam, thereby activating the doped impurity and improving the deteriorated crystallinity of the portions doped with the impurity. In this irradiation step, a KrF excimer laser (wavelength: 248 nm and pulse width: 20 nsec) is irradiated at the energy density of 150 to 400 mJ/cm$^2$, more preferably in the range of 200 to 250 mJ/cm$^2$. The sheet resistance of the P-type impurity (boron) regions 511 and 512 is in the range of 500 to 900 Ω/□.

A silicon oxide film having a thickness of about 600 nm is then formed as an interlevel insulating film 513. If a silicon oxide film is formed using TEOS as a source material by a plasma CVD method using oxygen, or by a low-pressure CVD method or an atmospheric-pressure CVD method using ozone, then a satisfactory interlevel insulating film excellent in a step coverage can be obtained.

Figure 7F:
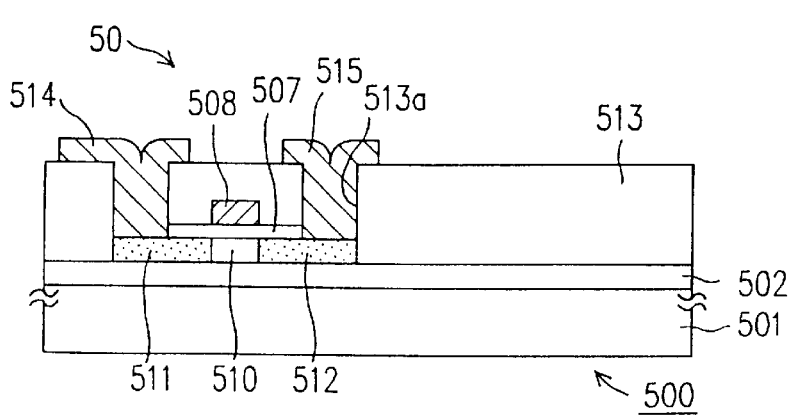

Contact holes 513a are then formed in the interlevel insulating film 513, thereby forming the electrode lines 514 and 515 for a TFT by using a double-layered film made of a metal material such as titanium nitride and aluminum. Finally, the annealing is conducted at 350° C. for 30 minutes under a hydrogen plasma environment, thereby completing the TFT 50 as shown in FIG. 7F.

In the case where the TFT thus obtained is used as a switching element for pixel electrodes, one of the electrode lines 514 and 515 is connected to the pixel electrode formed by a transparent conductive film made of indium tin oxide (ITO) and a signal is input from the other electrode. In the case where the TFT is used for a thin-film integrated circuit, it is required to form a contact hole on the gate electrode 509 and to provide necessary lines.

In the P-type TFT thus produced according to the method of this example, satisfactory characteristics can be obtained: the field-effect mobility is in the range of 70 to 90 cm$^2$/Vs and the threshold voltage is in the range of −4 to −6 V. The deviation of the TFT characteristics inside the substrate is within a range of ±10% in the field-effect mobility and ±5% in the threshold voltage.

By the above-described method of this example, it is also possible to obtain similar effects to those of the fourth example.

EXAMPLE 6

FIG. 8 is a plan view illustrating a thin-film transistor and a method for producing the same according to a sixth example of the present invention. FIGS. 9A to 9F are cross-sectional views taken along the line C–C' shown in FIG. 8 sequentially illustrating the respective steps for producing the TFT according to this sixth example of the invention.

As shown in FIGS. 9A to 9F, a semiconductor device 600 of this example includes a circuit 60 having a complementary metal-oxide-semiconductor (CMOS) structure for constituting a peripheral driver for an active matrix type liquid crystal display device or a generally used thin-film integrated circuit. This circuit 60 having a CMOS structure is obtained by connecting an N-type TFT 61 and a P-type TFT 62 so that these two TFTs operate complimentarily.

The N-type TFT 61 and the P-type TFT 62 are formed respectively on the glass substrate 601 via an insulating underlying film 602. Two island-shaped crystalline silicon films 603n and 603p for constituting the TFTs 61 and 62 are formed on the insulating underlying film 602 so as to be adjacent to each other. These crystalline silicon films 603n and 603p include an N-type channel region 610 and a P-type channel region 611 in the central portions thereof. An N-type source region 612 and an N-type drain region 613 are formed on the right and left sides of the crystalline silicon film 603n. A P-type source region 614 and a P-type drain region 615 are formed on the right and left sides of the crystalline silicon film 603p.

Two aluminum gate electrodes 608 and 609 are provided over the N-type channel region 610 and the P-type channel region 611 via a gate insulating film 607. The entire surfaces of the TFTs 61 and 62 are covered with an interlevel insulating film 616. Contact holes 616n are formed in the portions of the interlevel insulating film 616 corresponding to the source region 612 and the drain region 613 of the N-type TFT 61 while contact holes 616p are formed in the portions of the interlevel insulating film 616 corresponding to the source region 614 and the drain region 615 of the P-type TFT 62. The source region 612 and the drain region 613 of the N-type TFT 61 are connected to electrode lines 617 and 618 through these contact holes 616n, while the source region 614 and the drain region 615 of the P-type TFT 62 are connected to electrode lines 618 and 619 through these contact holes 616p.

The crystalline silicon films 603n and 603p are parts of the laterally crystallized silicon film which has been crystallized from a region to which the catalyst element has been added.

Next, a method for producing these TFTs 61 and 62 will be described below.

First, as shown in FIG. 9A, an underlying film 602 made of silicon oxide having a thickness of about 200 nm is formed on the glass substrate 601 by a sputtering technique or the like. An intrinsic (type I) amorphous silicon film (a-Si film) 603 having a thickness in the range of 25 to 100 nm, e.g., 50 nm, and a silicon oxide film 607 having a thickness in the range of 20 to 150 nm, e.g., 100 nm, are then continuously formed in the vacuum.

In this example, the a-Si film and the silicon oxide film are continuously formed by a plasma CVD method. The a-Si film is formed by decomposing and depositing silane ($SiH_4$) gas to be used as a source gas by heating the substrate at a temperature of 150° to 400° C., more preferably in the range of 200° to 300° C. The silicon oxide film is formed by decomposing and depositing tetra ethoxy silane (TEOS) to be used as a source gas with oxygen by heating the substrate at a temperature of 150° to 600° C., more preferably in the range of 300° to 450° C.

A silicon nitride film 604 having a thickness of 200 nm is then deposited over the entire surface of the substrate so as to cover the silicon oxide film. This film 604 is grown using a mixture of $SiH_4$, $NH_3$ and $N_2$ as a source gas by an RF plasma CVD method. The silicon nitride film 604 functions as a barrier film against the catalyst element to be used for the subsequent crystallization step of the a-Si film, and prevents the catalyst element from diffusing into the silicon oxide film 607.

Next, a through hole 604a is formed through the silicon oxide film 607 and the silicon nitride film 604, thereby exposing the a-Si film 603 in a slit shape through the hole 604a. That is to say, when the substrate in a state as shown in FIG. 9A is viewed from above, the a-Si film 603 is exposed in a slit shape in the region 600a, while the remaining portion of the a-Si film 603 is still masked by the silicon oxide film 607 and the silicon nitride film 604.

As shown in FIG. 9B, a nickel-based aqueous solution containing nickel acetate, nickel nitrate or the like is applied over the entire surface of the substrate and then dried uniformly by a spinner. In this case, the concentration of nickel in the aqueous solution is suitably in the range of 50 to 200 ppm, preferably 100 ppm. In the region 600a, precipitated Ni ions are in contact with the a-Si film 603, and therefore a small amount of nickel has already been added selectively to the region 600a. This region 600a is then annealed at a temperature of 550° C. for 16 hours, under a hydrogen reduction or an inactive ambient gas, so as to be crystallized.

In this case, the amorphous silicon film 603 is crystallized in the region 600a to which a small amount of nickel has been added in a direction vertical to the substrate 601, so that a crystalline silicon film 603a is formed. As indicated by the arrow 606 shown in FIG. 9C, the crystals then grow from the region 600a to the regions surrounding the crystallized region 600a in a lateral direction (or the direction parallel to the substrate), so that a laterally crystallized crystalline silicon film 603b is formed. The other regions of the amorphous silicon film remain the amorphous silicon film 603c. When the crystals are growing, the distance of the crystal growth in a direction parallel to the substrate as indicated by the arrow 606 is approximately 80 μm. The concentration of nickel in the region 603a crystallized by directly adding a small amount of nickel is $2\times10^{18}$ cm$^{-3}$, while the concentration of nickel in the laterally crystallized region 603b is approximately $8\times10^{16}$ cm$^{-3}$.

Next, by removing the silicon nitride film 604 and by irradiating the laser beam, the crystallization of the crystalline silicon film 603b is promoted. An XeCl excimer laser (wavelength: 308 nm; pulse width: 40 nsec) is used as the laser beam. The laser beam is irradiated by heating the substrate at a temperature of 200° to 450° C., e.g., 400° C. at the energy density of 200 to 400 mJ/cm$^2$, e.g., 300 mJ/cm$^2$.

As shown in FIG. 9D, the unnecessary portions of the silicon film except for the portions thereof to be used as the active regions (device regions) 603n and 603p of the TFT are then etched away so as to isolate the respective TFTs. Simultaneously, the silicon oxide film 607 formed on the silicon film 603 is patterned in the same shape as that of the island-shaped crystalline silicon films 603n and 603p.

Aluminum (containing 0.1 to 2% silicon) is then deposited by a sputtering technique on the silicon oxide film 607 so as to have a thickness of 400 to 800 nm, e.g., 600 nm. The aluminum film is then patterned so as to form gate electrodes 608 and 609.

Next, using the gate electrodes 608 and 609 as masks, the active regions 603n and 603p are doped with impurities (phosphorus and boron) by an ion doping method. Phosphine ($PH_3$) is used as a doping gas, the accelerating voltage is set to be in the range of 60 to 90 kV, e.g., 80 kV, and the implant dose is set to be $1\times10^{15}$ to $8\times10^{15}$ cm$^{-2}$, e.g., $2\times10^{15}$ cm$^{-2}$. Alternatively, diborane ($B_2H_6$) can be used as a doping gas, the accelerating voltage is set to be in the range of 40 to 80 kV, e.g., 65 kV, and the implant dose is set to be $1\times10^{15}$ to $8\times10^{15}$ cm$^{-2}$, e.g., $5\times10^{-2}$. By performing this step, the impurity-undoped regions being masked by the gate electrodes 608 and 609 will be used as the channel regions 610 and 611 for the TFTs 61 and 62. When doping the impurities, the respective elements are selectively doped by covering the regions which are not to be doped with a photoresist. As a result, N-type impurity regions 612 and 613, and P-type impurity regions 614 and 615 are formed, thereby forming an N-channel TFT (N-type TFT) 61 and a P-channel TFT (P-type TFT) 62 as shown in FIG. 9F.

As shown in FIG. 9E, the annealing is then conducted by the irradiation of the laser beam, thereby activating the doped impurities. In this irradiation step, an XeCl excimer laser (wavelength: 308 nm and pulse width: 40 nsec) is irradiated at the energy density of 300 mJ/cm$^2$ by focusing two pulses of the laser beam on each scanning position.

As shown in FIG. 9F, a silicon oxide film having a thickness of 600 nm is then formed by a plasma CVD method as an interlevel insulating film 616. Next, contact holes 616*n* and 616*p* are formed in the interlevel insulating film 616, thereby forming the electrode lines 617, 618 and 619 for a TFT by using a double-layered film made of a metal materials such as titanium nitride and aluminum. The annealing is then conducted at 350° C. for 30 minutes under a hydrogen plasma environment, thereby completing the TFTs 61 and 62 as shown in FIG. 9F.

In the circuit having a CMOS structure produced by the above-described method of this example, the N-type TFT 61 and the P-type TFT 62 have high field-effect mobilities of 150 to 200 cm$^2$/Vs and 100 to 120 cm$^2$/Vs, respectively, and have the threshold voltages of 1 to 2 V and −2 to −3 V, respectively. These TFTs exhibit very satisfactory characteristics.

According to the method of this example, the amorphous silicon film is further treated by irradiating the laser beam onto the laterally crystallized region in addition to the methods described in the fourth and the fifth examples, so that the effects of the improvement of the crystallinity of the silicon film constituting the active regions and the field-effect mobility of the carriers in the active regions can be further obtained, in addition to the effects described in the fourth and the fifth examples.

In the above description, the present invention has been described by way of the six examples. However, the present invention is not limited to the above-described six examples, but various modifications can be made based on the technological spirit of the invention.

In the above-described examples, in order to introduce selectively a small amount of nickel, a method in which a nickel-based aqueous solution is applied to the surface of the amorphous silicon film, or a method for forming a nickel super-thin film (thin enough to be only faintly observable as a film) are employed. A method for selectively introducing nickel ions to the amorphous silicon film by an ion doping method can also be employed as a method for adding nickel and thereby obtaining an advantage of controlling the concentration of nickel. In place of forming a nickel thin film, a small amount of nickel can be added by performing a plasma processing using Ni electrodes. As catalyst elements to be doped as impurities for promoting the crystallization of the amorphous silicon film other than nickel, cobalt, palladium, platinum, copper, silver, gold, indium, tin, aluminum, phosphorus, arsenic, or antimony can also be employed. The same effects can be obtained in such cases, too.

When employing a method for selectively introducing the catalyst element ions into the amorphous silicon film by an ion doping, there is no need for forming a through hole in the insulating thin film on the amorphous silicon film. If an energy allowing for transmitting through the insulating thin film is supplied to the catalyst element ions, then the catalyst element can be introduced into the amorphous silicon film under the insulating thin film, in the same way as in the first, second and third examples. In order to introduce the catalyst element into a selected region of the amorphous silicon film, a method in which a "photoresist film for providing through holes" to be used in the fourth to sixth examples are formed on the insulating thin film before the ion doping step and the catalyst element ions are introduced in such a state can also be employed. Alternatively, by using the photoresist, the portions of the insulating thin film corresponding to the through hole as described in the fourth to sixth examples are etched away so as to form a thin film, and then the catalyst element can be introduced through the thin film thus formed.

In the above-described examples, heat treatment is conducted using an excimer laser (or pulse laser) beam in order to promote the crystallinity of the crystalline silicon film. Other kinds of laser beams (e.g., a continuously oscillating Ar laser beam) can also be used for conducting a similar heat treatment. A so-called rapid thermal annealing (RTA) or a rapid thermal process (RTP) for heating a sample up to a temperature of 1000° to 1200° C. (i.e., the temperature of a silicon monitor) in a short period of time by using an intense light emitted from an infrared light and a flash lamp can also be utilized.

The present invention is applicable to various devices other than an active-matrix substrate for a liquid crystal display; such as a close-contact type image sensor, a driver-monolithic thermal head, a driver-monolithic optical write device or display device using organic electroluminescent (EL) elements as light-emitting elements, and a semiconductor device such as a three-dimensional IC, that is to say the invention is applicable to a semiconductor process in general. The organic electroluminescent (EL) elements herein refer to field-effect light-emitting elements using organic materials as the light-emitting materials. In the case of applying the present invention to these devices, high-performance characteristics such as a fast response and a high resolution can be realized for these devices.

As described above, according to a semiconductor device of the invention, the active region formed on an insulating substrate or an insulating thin film contains a catalyst element for promoting the crystallization of the amorphous silicon film by a heat treatment so that a highly reliable semiconductor device can be produced at a low temperature of 580° C. or lower. In other words, a semiconductor device including a high-performance thin-film transistor or the like exhibiting uniform and stable characteristics can be formed on an inexpensive large-scale substrate such as a glass substrate by conducting a simplified production process. Also, in a three-dimensional IC it is possible to prevent a thermal damage to be applied to the underlying semiconductor device so that the simplification of the production process and the improvement of the performance of the device can be advantageously realized.

Moreover, according to a method for producing a semiconductor device of the invention, the amorphous silicon film and the insulatingforme film are continuously formed on the substrate having insulation properties on the surface thereof with the atmosphere shut off, so that the interface between these films can be kept clean.

In addition, according to a method of the invention, the catalyst element for promoting the crystallization of the amorphous silicon film are introduced through the insulating thin-film into the amorphous silicon film by an ion implantation method and then the amorphous silicon film to which the catalyst element is introduced is crystallized by performing a heat-treatment, so that a high-quality crystalline silicon film having a satisfactory reproducibility and an even higher crystallinity than the crystallinity obtained by a generally used solid-phase growth method can be produced.

According to the invention, the heating temperature required for the crystallization can be set to be 580° C. or lower, so that an inexpensive glass substrate such as Corning 7059 glass substrate can be used.

According to the invention, after the amorphous silicon film to which the catalyst element is introduced is crystallized by performing a heat-treatment, the crystals are treated by irradiating a laser beam or an intense light beam onto the crystallized silicon film, so that the crystallinity of the crystalline silicon film constituting the active region can be improved, thereby further increasing the field-effect mobility of the carriers in the active region.

According to a method for producing a semiconductor device of the invention, the amorphous silicon film and the insulating thin-film can be continuously formed on the substrate without breaking a vacuum. Consequently the properties of the interface between the these films can be kept clean.

The catalyst element for promoting the crystallization of the amorphous silicon film is introduced into the amorphous silicon film and then the amorphous silicon film to which the catalyst element is introduced is crystallized by performing a heat treatment so that the crystallization of the amorphous silicon film can be conducted at a low temperature. In addition, by continuously performing the low temperature treatment the crystallized region can be further extended in a direction parallel to the surface of the substrate, thereby forming a laterally crystallized region to be used as an active region.

The crystalline silicon film for constituting the active region to be obtained by the crystallization of the amorphous silicon film have an even higher crystallinity than the crystallinity to be obtained by a generally used solid-phase growth method.

The heating temperature required for the crystallization can be set to be 580° C. or lower, so that an inexpensive glass substrate such as Corning 7059 glass substrate can be used.

The crystals are treated by irradiating a laser beam or an intense light beam onto the laterally crystallized region, so that the crystallinity of the crystalline silicon film constituting the active region can be improved, thereby further increasing the field-effect mobility of the carriers in the active region.

By using a crystalline silicon film, a semiconductor device of the type including an active layer on a substrate having an insulating surface and exhibiting uniform and stable characteristics can be formed on a large-scale substrate. Since the production process is performed at a low temperature, an inexpensive glass substrate can be used and therefore the necessary cost can be reduced.

The present invention is particularly effective to the improvement of the performance of an MOS transistor. In the case of applying this invention to a liquid crystal display device, the characteristics of a pixel switching TFT required for an active matrix substrate can be stabilized and at the same time the high-performance characteristics required for a TFT constituting a peripheral driving circuit are realized, so that a driver-monolithic type active matrix substrate including an active matrix portion and a peripheral driving circuit portion on an identical substrate is realized; thereby downsizing the module, realizing the higher performance thereof, and reducing the necessary cost. Also, in a three-dimensional IC, it is possible to realize a high-performance semiconductor device on an upper layer without causing a damage to the underlying transistor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device comprising the sequential steps of:

continuously forming, by a plasma CVD method, an amorphous silicon film and an insulating film to be used as a gate insulating film of the semiconductor device on a substrate having an insulating surface without exposing the substrate to an outside gas, no other process step being interposed between the amorphous silicon film formation and the insulating film formation;

introducing a catalyst element for promoting a crystallization of the amorphous silicon film through the insulating film into the amorphous silicon film by an ion implantation method, and wherein a channel region of the semiconductor device is formed in a region to which the catalyst has been implanted;

crystallizing at least a portion of the amorphous silicon film, to which the catalyst is added, by a heat treatment; and forming a gate electrode on the insulating film.

2. A method for producing a semiconductor device according to claim 1, further comprising the step of irradiating a laser beam or an intense light beam onto the crystallized silicon film.

3. A method for producing a semiconductor device comprising the sequential steps of:

continuously forming, by a plasma CVD method, a first insulating film, an amorphous silicon film and a second insulating film on a substrate without exposing the substrate to an outside gas, the second insulating film being used as a gate insulating film of the semiconductor device, no other process step interposed between the first insulating film formation and the amorphous silicon film formation and between the amorphous silicon film formation and the second insulating film formation;

introducing a catalyst element for promoting a crystallization of the amorphous silicon film through the second insulating film into the amorphous silicon film by an ion implantation method, and wherein a channel region of the semiconductor device is formed in a region to which the catalyst has been implanted;

crystallizing at least a portion of the amorphous silicon film, to which the catalyst is added, by a heat treatment; and forming a gate electrode on the insulating film.

4. A method for producing a semiconductor device according to claim 3 further comprising the step of irradiating a laser beam or an intense light beam onto the crystallized silicon film.

5. A method for producing a semiconductor device according to claim 3, wherein the catalyst element is implanted into the amorphous silicon film at an implant dose ranging from $1\times10^{11}$ to $1\times10^{14}$ atoms/cm$^2$.

6. A method for producing a semiconductor device according to claim 3, wherein at least one element selected from a group consisting of Ni, Co, Pd, Pt, Cu, Ag, Au, In, Sn, Al and Sb is used as the catalyst element.

7. A method for producing a semiconductor device according to claim 1, further comprising the step of patterning, after the crystallization of the amorphous silicon film, the crystallized silicon film and the insulating film into an island-shaped pattern.

8. A method for producing a semiconductor device according to claim 7, wherein the patterned insulating film has the same shape with that of the patterned crystallized silicon film.

9. A method for producing a semiconductor device according to claim 3, further comprising the step of patterning, after the crystallization of the amorphous silicon film, the crystallized silicon film and the second insulating film into an island-shaped pattern.

10. A method for producing a semiconductor device according to claim 9, wherein the patterned second insulating film has the same shape with that of the patterned crystallized silicon film.

* * * * *